(12) United States Patent
Rautio

(10) Patent No.: US 8,479,127 B1
(45) Date of Patent: *Jul. 2, 2013

(54) NETWORK ACCESSIBLE SYSTEM FOR SYNTHESIS OF AN ELECTRONIC CIRCUIT MODEL

(75) Inventor: James C. Rautio, Phoenix, NY (US)

(73) Assignee: Sonnet Software, Inc., North Syracuse, NY (US)

( * ) Notice: Subject to any disclaimer, the term of this patent is extended or adjusted under 35 U.S.C. 154(b) by 125 days.

This patent is subject to a terminal disclaimer.

(21) Appl. No.: 13/108,553

(22) Filed: May 16, 2011

Related U.S. Application Data

(63) Continuation-in-part of application No. 11/756,129, filed on May 31, 2007, now Pat. No. 7,945,876.

(60) Provisional application No. 60/850,960, filed on Oct. 10, 2006.

(51) Int. Cl.
*G06F 17/50* (2006.01)

(52) U.S. Cl.
USPC .......... 716/104; 716/100; 716/106; 716/110; 716/136

(58) Field of Classification Search
USPC .................. 716/100, 104, 106, 110, 136
See application file for complete search history.

(56) References Cited

U.S. PATENT DOCUMENTS

| | | | |
|---|---|---|---|
| 6,163,762 A | 12/2000 | Rautio | |
| 6,366,874 B1* | 4/2002 | Lee et al. | 703/14 |
| 7,356,791 B2 | 4/2008 | Rautio | |
| 7,945,876 B2 | 5/2011 | Rautio | |
| 2002/0156757 A1* | 10/2002 | Brown | 707/1 |

OTHER PUBLICATIONS

James C. Rautio and Robert Groves, A Potentially Significant On-Water High-Frequency Measurement Calibration Error, IEEE Microwave Magazine, Dec. 2005, 5 pgs.

James C. Rautio, Fellow, IEEE, Deembedding the Effect of a Local Ground Plane in Electromagnetic Analysis, IEEE Transactions on Microwave Theory and Techniques, vol. 53, No. 2, Feb. 2005, 7 pgs.

James C. Rautio. Fellow, IEEE, and Vladimir I. Okhmatovski, Member, IEEE, Unification of Double Delay and SOC Electromagnetic De-embedding, MTT-2758 Rautio and Okmatovski, May 16, 2005, 8 pgs.

James C. Rautio, Fellow, IEEE, A Conformal Mesh for Efficient Planar Electromagnetic Analysis, IEEE Transactions on Microwave Theory and Techniques, vol. 52, No. 1, Jan. 2004, 8 pgs.

James C. Rautio, EM Approach Sets New Speed Records, Microwaves & RF, May 2002, 8 pgs.

Shawn Carpenter, Break and Interpolate Technique: A Strategy for fast EM Simulation of Planar Filters, Sonnet Technical Document Series as published in the Oct. 2000 issue of Microwave Product Digest, 18 pgs.

(Continued)

*Primary Examiner* — Sun Lin
(74) *Attorney, Agent, or Firm* — Hiscock & Barclay, LLP; R. Stephen Rosenholm; Christopher J. White

(57) ABSTRACT

A network accessible system for synthesizing (constructing) an electronic circuit model in response to electromagnetic analysis data. The invention provides rapid automation of the synthesis of an electronic circuit model by incorporating one or more synthesized electronic model components that are selected from a larger plurality of synthesized (candidate) electronic components whose structure and electromagnetic characteristics are rapidly and automatically synthesized in response to the electromagnetic analysis data.

16 Claims, 21 Drawing Sheets

OTHER PUBLICATIONS

James C. Rautio, Synthesis of Lumped Models from N-Port Scattering Parameters Data, IEEE Transactions on Microwave Theory and Techniques, vol. 42, No. 3, Mar. 1994, 3 pgs.

James C. Rautio, Testing Limits of Algorithms Associated with High Frequency Planar Electromagnetic Analysis, Sonnet Software, Inc., USA, 4 pgs.

Dr. James C. Rautio, Eletromagnetic Analysis Speeds RFID Design, Sonnet Software, Inc., Published in Microwaves & RF, Feb. 2003, 13 pgs.

James C. Rautio, Free EM Simulator Analyzes Spiral Inductor on Silicon, Published in Microwaves & RF Magazine, Sep. 1999, 14 pgs.

James C. Rautio, Tips and Tricks for Using Sonnet® Life, First published in Microwave Product Digest, Oct. 1999, 13 pgs.

James C. Rautio, Rigorous Evaluation of Worst Case Total Crosswalk in the Time domain Using Frequency Domain Scattering Parameters, DesignCon 2001, 10 pgs.

James C. Rautio, Applied Numerical Electromagnetic Analysis for Planar High-Frequency Circuits, 16 pgs.

James C. Rautio, The Impact on Education of Widely Available Commercial 3-D Planar Electromagnetic Software, Computer Application in Engineering Education, 18 pgs.

James C. Rautio, Fellow, IEEE, and Veysel Demir, *Student Member*, IEEE, Microstrip Conductor Loss Models for Electromagnetic Analysis, IEEE Transactions on Microwave Theory and Techniques, vol. 51, No. 3, Mar. 2003, 7 pgs.

James C. Rautio, Planar Electromagnetic Analysis, IEEE Microwave Magazine, 2003, 7 pgs.

Sonnet Software, Inc., Planar EM Analysis: A New Standard for High Frequency Applications, Microwave Journal, Nov. 2004, 4 pgs.

James C. Rautio, Member, IEEE, and Roger F. Harrington, Fellow, IEEE, An Electromagnetic Time-Harmonic Analysis of Shielded Microstrip Circuits, IEEE Transaction on Microwave Theory and Techniques, vol. MTT-35, No. 8, Aug. 1987, 5 pgs.

James C. Rautio, A De-Embedding Algorithm for Electromagnetics, International Journal of Microwave and Millimeter-Wave Computer-Aided Engineering, vol. 1 No. 3 282-287, 1991, 6 pgs.

James C. Rautio, Application Notes, An Investigation of Microchip Conductor Loss, Microwave, Dec. 2000, 8 pgs.

James C. Rautio, Planar Electromagnetic Software-Personal Reflections, Microwave Journal, Mar. 2005, 5 pgs.

\* cited by examiner (EQUATION 1)
$$340 \rightarrow \underset{340b}{y} = \underset{340a}{g} + jb = \frac{R}{R^2 + X^2} = j\frac{X}{R^2 + X^2} \quad \underset{340c}{\phantom{X}} \underset{340d}{\phantom{X}}$$

(EQUATION 2)
$$342 \rightarrow y = 1/R_A + j\omega C + 1/(R_B + j\omega L)$$
with labels 342a, 342b, 342c, 342d.

(EQUATION 3)
$$344 \rightarrow L/R_B = \frac{\omega_2 b_1 - \omega_1 b_2}{\omega_1 \omega_2 (g_2 - g_1)}$$

(EQUATION 4)
$$346 \rightarrow R_B = \frac{(\omega_2^2 - \omega_1^2)(L/R_B)^2}{(g_1 - g_2)(1 + \omega_1^2 (L/R_B)^2)(1 + \omega_2^2 (L/R_B)^2)}$$

(EQUATION 5)
$$348 \rightarrow 1/R_A + j\omega_1 C = y_1 - \frac{1}{R_B + j\omega_1 L}$$
with labels 348a, 348b, 348c.

(EQUATION 6)
$$350 \rightarrow 1/R_A = g_1 - R_B/(R_B^2 + \omega_1^2 L^2)$$
with labels 350a, 350b, 350c.

(EQUATION 7)
$$352 \rightarrow \omega_1 C = b_1 + \frac{\omega_1 L}{R_B^2 + \omega_1^2 L^2}$$
with labels 352a, 352b, 352c.

FIG.3C

| FREQUENCY (W) | CONDUCTANCE (G) | SUSCEPTANCE (B) |
|---|---|---|
| (GIGAHERTZ) | (SEIMENS) | (SEIMENS) |
| 1.00000000 | 0.014683 | −0.02666 |
| 2.00000000 | 0.011183 | 0.005309 |
| 3.00000000 | 0.010527 | 0.024457 |
| 4.00000000 | 0.010297 | 0.040327 |
| 5.00000000 | 0.010190 | 0.054879 |
| 6.00000000 | 0.010132 | 0.068769 |
| 7.00000000 | 0.010097 | 0.082282 |
| 8.00000000 | 0.010074 | 0.095558 |
| 9.00000000 | 0.010059 | 0.108677 |
| 10.0000000 | 0.010047 | 0.121685 |

Figure 3F $$Y = g + jb = \frac{1}{R_A} + j\omega C + \frac{1}{R_B + j\omega L} \quad \leftarrow 342$$

$$Y = \frac{1}{R_A} + j\omega C + \frac{1}{R_B + j\omega L}\left(\frac{R_B - j\omega L}{R_B - j\omega L}\right)$$

$$Y = \frac{1}{R_A} + j\omega C + \frac{R_B - j\omega L}{R_B^2 + (\omega L)^2}\left(\frac{1/L^2}{1/L^2}\right)$$

$$Y = \frac{1}{R_A} + j\omega C + \left(\frac{\frac{R_B}{L^2} - j\frac{\omega}{L}}{\left(\frac{R_B}{L}\right)^2 + \omega^2}\right)$$

$$Y = \frac{1}{R_A} + j\omega C + \frac{R_B / L^2}{(R_B/L)^2 + \omega^2}\left(\frac{L^2}{L^2}\right) - j\frac{\omega/L}{(R_B/L)^2 + \omega^2}$$

$$Y = \frac{1}{R_A} + \frac{R_B}{R_B^2 + \omega^2 L^2} + j\omega\left(C - \frac{\omega/L}{(R_B/L)^2 + \omega^2}\right) \quad \leftarrow 343a$$

$\uparrow$      $\uparrow$      $\uparrow$ (Real)    (Real)    (Imaginary)

$$(g_1 - g_2) = \frac{R_B}{R_B^2 + \omega_1^2 L^2} - \frac{R_B}{R_B^2 + \omega_2^2 L^2}$$

$$(g_1 - g_2) = \frac{R_B(R_B^2 + \omega_2^2 L^2)}{(R_B^2 + \omega_1^2 L^2)(R_B^2 + \omega_2^2 L^2)} - \frac{R_B(R_B^2 + \omega_1^2 L^2)}{(R_B^2 + \omega_2^2 L^2)(R_B^2 + \omega_1^2 L^2)}$$

$$(g_1 - g_2) = \frac{R_B^3 + \omega_2^2 R_B L^2}{(R_B^2 + \omega_1^2 L^2)(R_B^2 + \omega_2^2 L^2)} - \frac{R_B^3 + \omega_1^2 R_B L^2}{(R_B^2 + \omega_2^2 L^2)(R_B^2 + \omega_1^2 L^2)}$$

$$(g_1 - g_2) = \frac{R_B L^2 (\omega_2^2 - \omega_1^2)}{(R_B^2 + \omega_1^2 L^2)(R_B^2 + \omega_2^2 L^2)} \quad \leftarrow 343b$$

$\uparrow$ (Real)

FIG. 3F (Continued)

$$\left(\frac{b_1}{\omega_1} - \frac{b_2}{\omega_2}\right) = \frac{\omega_1}{\omega_1}\left(C - \frac{1/L}{(R_B/L)^2 + \omega_1^2}\right) - \frac{\omega_2}{\omega_2}\left(C - \frac{1/L}{(R_B/L)^2 + \omega_2^2}\right)$$

$$\left(\frac{b_1}{\omega_1} - \frac{b_2}{\omega_2}\right) = \frac{1/L}{(R_B/L)^2 + \omega_2^2} - \frac{1/L}{(R_B/L)^2 + \omega_1^2}$$

$$\left(\frac{b_1}{\omega_1} - \frac{b_2}{\omega_2}\right) = \frac{1/L}{(R_B/L)^2 + \omega_2^2}\left(\frac{L^2}{L^2}\right) - \frac{1/L}{(R_B/L)^2 + \omega_1^2}\left(\frac{L^2}{L^2}\right)$$

$$\left(\frac{b_1}{\omega_1} - \frac{b_2}{\omega_2}\right) = \frac{L}{R_B^2 + \omega_2^2 L^2} - \frac{L}{R_B^2 + \omega_1^2 L^2}$$

$$\left(\frac{b_1}{\omega_1} - \frac{b_2}{\omega_2}\right) = \frac{L(R_B^2 + \omega_1^2 L^2)}{(R_B^2 + \omega_2^2 L^2)(R_B^2 + \omega_1^2 L^2)} - \frac{L(R_B^2 + \omega_2^2 L^2)}{(R_B^2 + \omega_1^2 L^2)(R_B^2 + \omega_2^2 L^2)}$$

$$\left(\frac{b_1}{\omega_1} - \frac{b_2}{\omega_2}\right) = \frac{LR_B^2 + \omega_1^2 L^3 - LR_B^2 - \omega_2^2 L^3}{(R_B^2 + \omega_2^2 L^2)(R_B^2 + \omega_1^2 L^2)} = \frac{(\omega_1^2 - \omega_2^2)L^3}{(R_B^2 + \omega_2^2 L^2)(R_B^2 + \omega_1^2 L^2)}$$

Let $b_1' - b_2' = \frac{b_1}{\omega_1} - \frac{b_2}{\omega_2}$ $$\frac{b_1' - b_2'}{g_1 - g_2} = \frac{\dfrac{(\omega_1^2 - \omega_2^2)L^3}{(R_B^2 + \omega_2^2 L^2)(R_B^2 + \omega_1^2 L^2)}}{\dfrac{R_B L^2(\omega_2^2 - \omega_1^2)}{(R_B^2 + \omega_1^2 L^2)(R_B^2 + \omega_2^2 L^2)}} = \frac{(\omega_1^2 - \omega_2^2)L^3}{R_B L^2(\omega_2^2 - \omega_1^2)} = -\frac{L}{R_B}$$

thus $$\frac{L}{R_B} = -\frac{b_1' - b_2'}{g_1 - g_2} = \frac{b_2' - b_1'}{g_1 - g_2} = \frac{\dfrac{b_2}{\omega_2} - \dfrac{b_1}{\omega_1}}{g_1 - g_2} = \left(\frac{\dfrac{b_2}{\omega_2} - \dfrac{b_1}{\omega_1}}{g_1 - g_2}\right)\left(\frac{\omega_1 \omega_2}{\omega_1 \omega_2}\right) = \frac{b_2 \omega_1 - b_1 \omega_2}{\omega_1 \omega_2 (g_1 - g_2)}$$

$$\frac{L}{R_B} = \frac{b_2 \omega_1 - b_1 \omega_2}{\omega_1 \omega_2 (g_1 - g_2)} \quad \leftarrow 344$$

FIG. 3F (Continued)

$$(g_1 - g_2) = \frac{R_B L^2 (\omega_2^2 - \omega_1^2)}{(R_B^2 + \omega_1^2 L^2)(R_B^2 + \omega_2^2 L^2)} \left( \frac{1/R_B^4}{1/R_B^4} \right)$$

$$(g_1 - g_2) = \frac{(1/R_B)(L/R_B)^2 (\omega_2^2 - \omega_1^2)}{(1 + \omega_1^2 (L/R_B)^2)(1 + \omega_2^2 (L/R_B)^2)}$$

$$R_B = \frac{(L/R_B)^2 (\omega_2^2 - \omega_1^2)}{(g_1 - g_2)(1 + \omega_1^2 (L/R_B)^2)(1 + \omega_2^2 (L/R_B)^2)} \leftarrow 346$$

| FREQUENCY (W) ⟵482 | CONDUCTANCE DIFFERENCE (G) ⟵484 | SUSCEPTANCE DIFFERENCE (B) ⟵486 | SUM OF SQUARED DIFFERENCES ⟵488 |
|---|---|---|---|
| (GIGAHERTZ) | (SEIMENS) | (SEIMENS) | (SEIMENS SQUARED) |
| 1.00000000 | 0.000000 | 0.000000 | 0.00000000 |
| 2.00000000 | 0.000000 | 0.010000 | 0.00010000 |
| 3.00000000 | 0.000100 | 0.010000 | 0.00010001 |
| 4.00000000 | 0.000100 | 0.020000 | 0.00040001 |
| 5.00000000 | 0.000200 | 0.020000 | 0.00040004 |
| 6.00000000 | 0.000200 | 0.020000 | 0.00040004 |
| 7.00000000 | 0.000100 | 0.020000 | 0.00040001 |
| 8.00000000 | 0.000100 | 0.010000 | 0.00010001 |
| 9.00000000 | 0.000000 | 0.010000 | 0.00010000 |
| 10.0000000 | 0.000000 | 0.000000 | 0.00000000 |

TOTAL SUM OF SQUARED DIFFERENCES  0.00200012 ⟵490

FIG. 5C
540
542
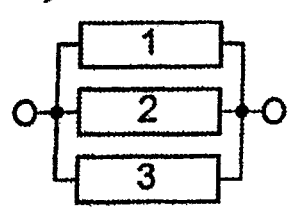
544
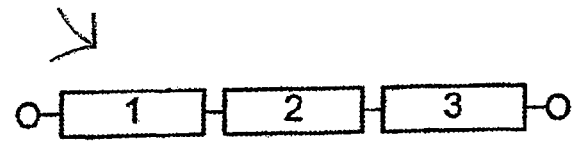
546
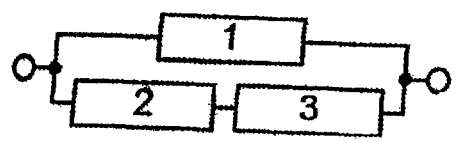
548
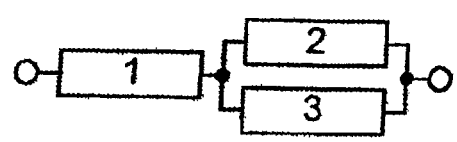

FIG. 5D
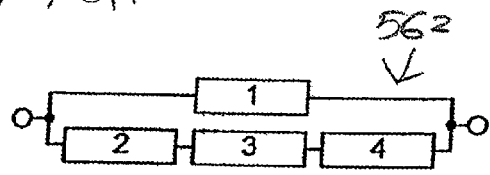
562
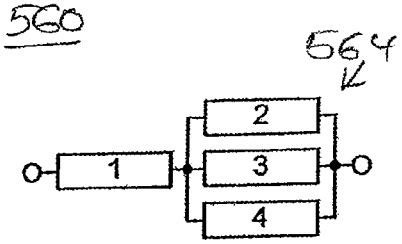
560   564
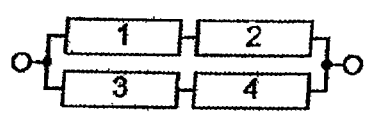
566
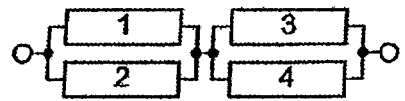
568
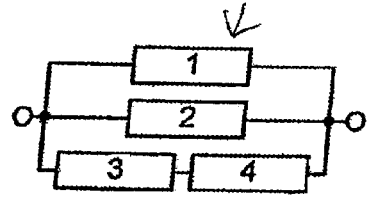
620
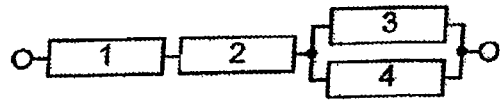
622
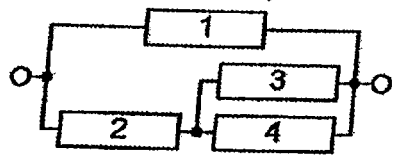
624
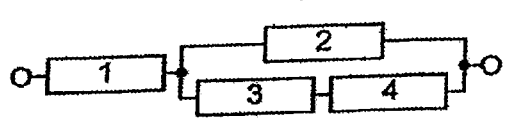
626

FIG. 5E

580a → $Z = j Z_0 \operatorname{ctn}(a)$   580

580b → $y = j Y_0 \tan(a)$

590a → $Z = j Z_0 \tan(a)$   590

590b → $y = -j Y_0 \operatorname{ctn}(a)$

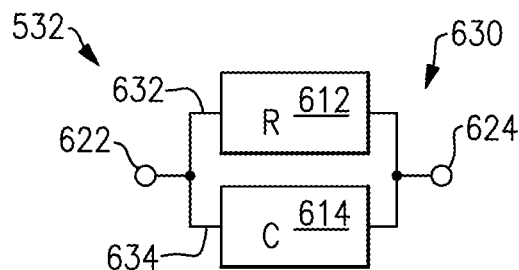
FIG.6A
$$y = g + jb = 1/R + j\omega C$$
FIG.6B
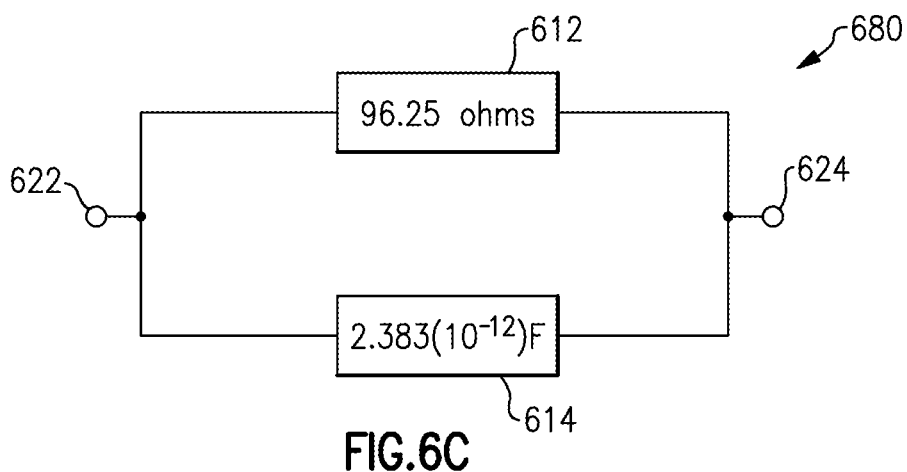
FIG.6C

690

| FREQUENCY (W) | CONDUCTANCE (G) | SUSCEPTANCE (B) |
|---|---|---|
| (GIGAHERTZ) | (SEIMENS) | (SEIMENS) |
| 1.00000000 | 0.010390 | 0.014976 |
| 2.00000000 | 0.010390 | 0.029952 |
| 3.00000000 | 0.010390 | 0.044927 |
| 4.00000000 | 0.010390 | 0.059903 |
| 5.00000000 | 0.010390 | 0.074879 |
| 6.00000000 | 0.010390 | 0.089856 |
| 7.00000000 | 0.010390 | 0.104832 |
| 8.00000000 | 0.010390 | 0.119808 |
| 9.00000000 | 0.010390 | 0.134784 |
| 10.0000000 | 0.010390 | 0.149760 |

| FREQUENCY (W) | CONDUCTANCE DIFFERENCE (G) | SUSCEPTANCE DIFFERENCE (B) | SUM OF SQUARED DIFFERENCES |
|---|---|---|---|
| (GIGAHERTZ) | (SEIMENS) | (SEIMENS) | (SEIMENS SQUARED) |
| 1.00000000 | 0.004293 | 0.041636 | 0.00175200 |
| 2.00000000 | 0.000793 | 0.014643 | 0.00010000 |
| 3.00000000 | 0.000237 | 0.010470 | 0.00020890 |
| 4.00000000 | 0.000007 | 0.000424 | 0.00000020 |
| 5.00000000 | 0.000000 | 0.000000 | 0.00000000 |
| 6.00000000 | 0.000058 | 0.001087 | 0.00000120 |
| 7.00000000 | 0.000193 | 0.002550 | 0.00000650 |
| 8.00000000 | 0.000216 | 0.014250 | 0.00020310 |
| 9.00000000 | 0.000331 | 0.016107 | 0.00025950 |
| 10.0000000 | 0.000343 | 0.028075 | 0.00078800 |
| | TOTAL SUM OF SQUARED DIFFERENCES | | 0.0331940 |

FIG.6E

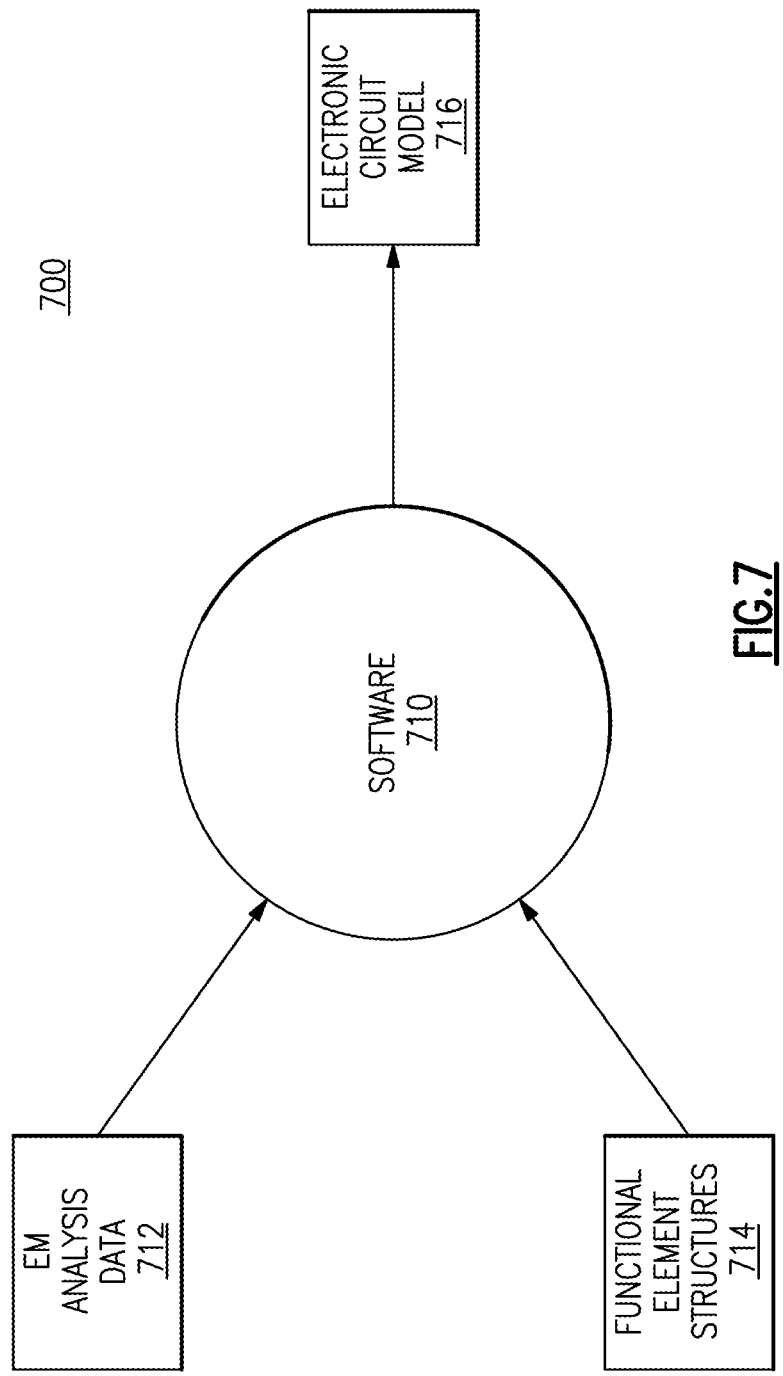

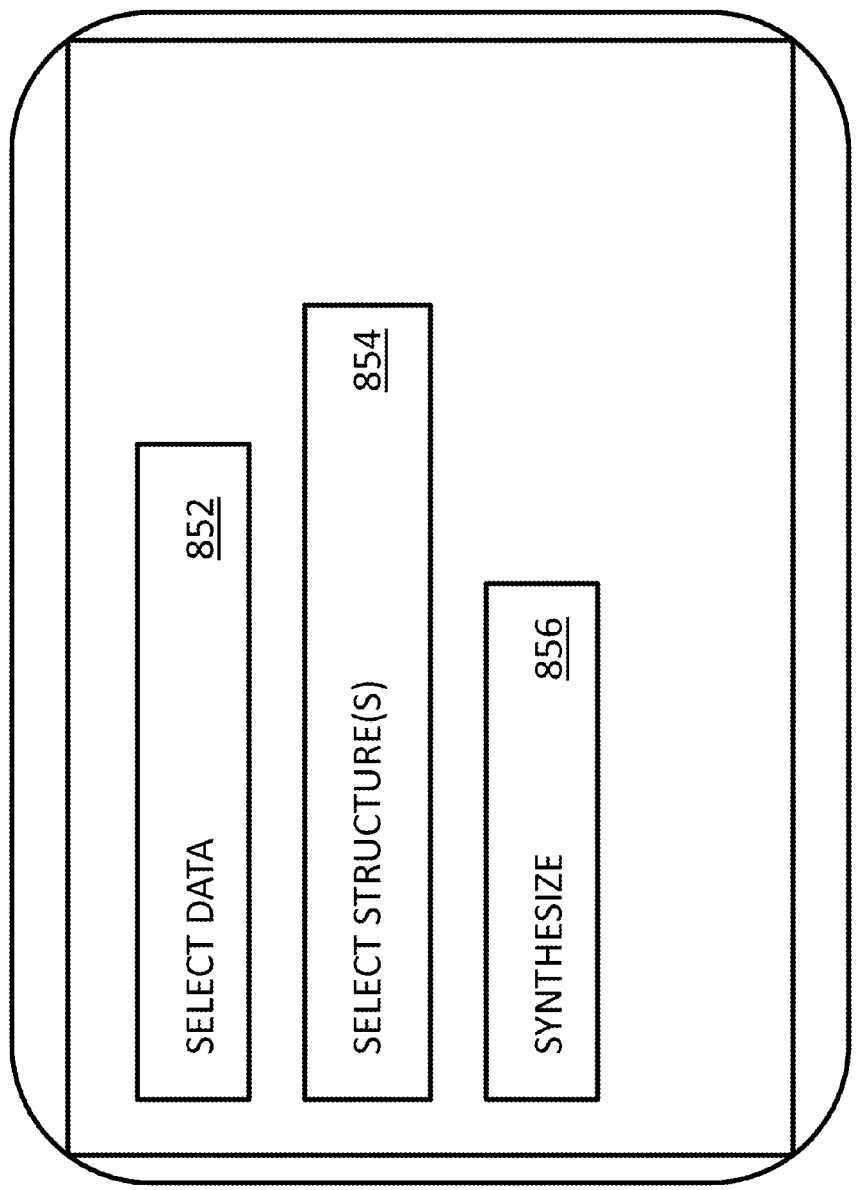

NETWORK ACCESSIBLE SYSTEM FOR SYNTHESIS OF AN ELECTRONIC CIRCUIT MODEL

CROSS-REFERENCE TO APPLICATIONS INCLUDING RELATED SUBJECT MATTER

This is a non-provisional utility patent application that claims priority to, is a child patent application of, and a continuation-in-part (CIP) patent application under 37 C.F.R. 1.53(b) of, a parent non-provisional patent application having a Ser. No. 11/756,129, that was filed on May 31, 2007 (now U.S. Pat. No. 7,945,876; issued May 17, 2011) and titled "METHOD AND APPARATUS FOR AUTOMATIC SYNTHESIS OF AN ELECTRONIC CIRCUIT MODEL". This non-provisional patent application further claims priority to a commonly owned U.S. Provisional patent application Ser. No. 60/850,960, filed Oct. 10, 2006 and titled "Synthesis of Compact Lumped Models from Electromagnetic Analysis Results". This non-provisional patent application also includes subject matter that is related to the subject matter of a commonly owned U.S. patent application Ser. No. 11/171,935, filed Jun. 30, 2005 and titled "Method and Apparatus for Rapid Electromagnetic Analysis" which later issued as U.S. Pat. No. 7,356,791. All of the aforementioned patent applications and/or patents are incorporated herein by reference in their entirety.

FIELD OF THE INVENTION

This invention relates generally to synthesizing (constructing) an electronic circuit model in response to electromagnetic analysis data, and in particular to rapid automation of the synthesis of an electronic circuit model. The synthesized circuit model incorporates one or more synthesized electronic model components that are selected from a larger plurality of synthesized (candidate) electronic components whose structure and electromagnetic characteristics are automatically synthesized in response to the electromagnetic analysis data.

BACKGROUND OF THE INVENTION

Generating an electronic circuit model from the results of electromagnetic analysis typically involves synthesis (configuration) of an electronic component so that the overall electromagnetic characteristics of the electronic component at least approximate the results of the electromagnetic analysis. The structure of the electronic component may or may not resemble a corresponding electronic component within an actual electronic circuit that is associated with the electromagnetic analysis.

Synthesis of an electronic component typically involves a non-fully automated process of setting values to one or more individual electrical properties of the electronic component in order to approximate (mimic) the results of electromagnetic analysis. The process of synthesis is typically iterative, and often, the final overall electromagnetic characteristics of synthesized electronic component approximate, but do not match the results of electromagnetic analysis.

SUMMARY OF THE INVENTION

In one aspect, the invention provides for a method and apparatus for synthesizing (constructing) electronic components of an electronic circuit model in response to electromagnetic circuit analysis data. The electronic circuit model incorporates one or more electronic model components that are selected from a larger plurality of candidate electronic model components. The candidate electronic model components are structured to possess electronic properties and electromagnetic characteristics that match a synthesis portion of the electromagnetic data, also referred to as synthesis data, and are automatically and rapidly synthesized (configured) from the electromagnetic circuit analysis data.

In some circumstances, the electromagnetic analysis data can be obtained as a result of applying one or more frequencies to a physical electronic circuit and measuring an electromagnetic coupling between least one pair of ports residing within the physical electronic circuit. In other circumstances, the electromagnetic analysis data can be obtained from an evaluation or simulation associated with a non-physical representation or an electronic circuit. Preferably, the electromagnetic analysis data is associated with one or more frequencies.

In accordance with the invention, the electromagnetic analysis data is apportioned into a synthesis portion and a non-synthesis portion. The synthesis portion is also referred to herein as synthesis data and the non-synthesis data portion is also referred to herein as non-synthesis data. The synthesis data and non-synthesis data are selected from within the electromagnetic analysis data.

Synthesis of each candidate electronic model component yields a synthesized component possessing overall electromagnetic characteristics that match the electromagnetic characteristics of the synthesis data. Evaluation and selection of each synthesized component is based upon an evaluation of proximity of the electromagnetic characteristics of each synthesized component with respect to the electromagnetic characteristics of the non-synthesis data.

The synthesized data and non-synthesized data are each preferably characterized in terms of an associated electromagnetic measurement type and an associated frequency. An associated electromagnetic measurement type can be expressed as an admittance, a conductance, a susceptance, an impedance, a resistance or a reactance value, for example. An associated frequency can be expressed as a 1 Ghz, a 2 Ghz or a 10 Ghz frequency, for example.

Preferably, the synthesis and non-synthesis data are maximally different from each other, meaning that synthesis data and non-synthesis data have a minimum of common data and preferably do not share (do not include) common data. One instance of data is a grouping of data that has one associated electromagnetic measurement type and one associated frequency. Hence, synthesis and non-synthesis data preferably do not include a portion of data having the one same associated electromagnetic measurement type and one same associated frequency.

For example, in some embodiments, synthesis data and non-synthesis data can each include data having a same associated electromagnetic measurement type, or can include data having a same associated frequency, but preferably do not include the same data, where the same data has both a same associated electromagnetic measurement type and same associated frequency.

In some embodiments, both the synthesis data and the non-synthesis data are selected as data having one same associated electromagnetic measurement type and different associated frequencies. In this type of embodiment, an electronic component is both synthesized and evaluated using electromagnetic analysis data associated with one electromagnetic measurement type. However, the electronic component is synthesized in association with a first set of synthesis frequencies and evaluated in association with a second and different set of non-synthesis frequencies.

For example, both the synthesis data and the non-synthesis data can be selected to entirely include one type of electromagnetic measurement data. However, a first set of synthesis frequencies that are associated with the synthesis data, and a second set of frequencies that are associated with the non-synthesis data, do not overlap (intersect) with each other and hence, do not include any common frequencies.

For example, synthesis data can be selected as entirely admittance (electromagnetic measurement) data that is associated with a first set of synthesis frequencies that include only the 1 Ghz, 2 Ghz and 5 Ghz frequencies. Non-synthesis data can also be selected entirely as admittance (electromagnetic measurement) data associated with a second set of synthesis frequencies that include only the 3 Ghz, 4 Ghz and 6 Ghz frequencies.

Alternatively, in other embodiments, an electronic component can be synthesized using data of a first associated electromagnetic measurement type and evaluated using data of another second electromagnetic measurement type. For example, the synthesis data can be selected entirely as reactance (electromagnetic measurement) data that is associated with each of a first set of synthesis frequencies. The non-synthesis data is instead selected as resistance (electromagnetic measurement) data that is associated with each of a second set of frequencies.

In this type of embodiment, there can be one or more common frequencies that reside within both the first set of synthesis frequencies and the second set of non-synthesis frequencies without constituting redundancy between the synthesis and non-synthesis data. The one or more common frequencies have associated reactance (electromagnetic measurement) data that resides within the synthesis data and also have associated resistance (electromagnetic measurement) data that resides within the non-synthesis data.

In some variations of this type of embodiment, the first set of synthesis frequencies and the second set of non-synthesis frequencies are equal and overlap entirely. In other variations of this embodiment, the first set of synthesis frequencies and the second set of non-synthesis frequencies have overlap partially, meaning that there is at least one frequency common to both the first set of synthesis frequencies and second set of non-synthesis frequencies. In other yet other variations of this type of embodiment, the first set of synthesis frequencies and the second set of non-synthesis frequencies have no overlap.

Evaluation of each synthesized component quantifies the proximity of the electromagnetic characteristics of the synthesized component to the electromagnetic characteristics of the non-synthesis data. Selection of a synthesized model component results in identification of a synthesized model component, among a larger plurality of synthesized model components, that yields electromagnetic characteristics that are most proximate to the electromagnetic characteristics of the selected non-synthesis data.

Generally, when electromagnetic characteristics of a synthesized electronic model component match the electromagnetic characteristics of synthesis data, the more proximate the electromagnetic characteristics of the synthesized electronic model component are with respect to the non-synthesis data, and the more desirable that component is with respect to selection and incorporation into a synthesized model. The proximity of the synthesized electronic model component with respect to the electromagnetic characteristics of synthesis data can be measured according to one or more different measures of proximity.

In some embodiments, digital logic, such as encoded within firmware or software, is employed to construct an electronic circuit model in accordance with the invention. The software/firmware is configured to input electromagnetic analysis data and to output a representation of an electronic circuit model in accordance with the invention described herein. In some embodiments, the data and/or representation of the electronic circuit model are stored as files, such as Microsoft Windows operating system compliant files, onto one or more persistent storage devices.

The foregoing as well as other objects, aspects, features, and advantages of the invention will become more apparent from the following description and from the claims.

BRIEF DESCRIPTION OF THE DRAWINGS

The objects and features of the invention can be better understood with reference to the claims and drawings described below. The drawings are not necessarily to scale, the emphasis is instead generally being placed upon illustrating the principles of the invention. Within the drawings, like reference numbers are used to indicate like parts throughout the various views. Differences between like parts may cause those parts to be indicated by different reference numbers. Unlike parts are indicated by different reference numbers.

FIG. 3C illustrates a set of mathematical equations associated with the functional element structure of the model component of FIG. 3B.

FIG. 3F illustrates a derivation of the equations of FIG. 3C.

FIG. 4C includes a table that illustrates one embodiment of a method of measuring differences between the electromagnetic characteristics of the synthesized component 380 of FIG. 3D and the electromagnetic characteristics of the electromagnetic analysis data of FIG. 2.

FIG. 5C illustrates (4) three element opaque (generic) element structure of a model component that can be further configured into one of various functional element structures.

FIG. 5D illustrates (8) four element opaque (generic) element structures that can be each further configured (specified) into one of various functional element structures (arrangements).

FIG. 5E illustrates equations that are employed to determine the actual impedance of an open circuited or short (closed) circuited transmission line.

FIG. 6A illustrates a two element functional element structure (component) that is also illustrated as component in FIG. 5B.

FIG. 6B illustrates a set of mathematical equations associated with the functional element structure of the model component of FIG. 6A.

FIG. 6C illustrates a synthesized component that is configured with specific element rating values based upon the electromagnetic analysis data associated with selected synthesis frequencies of 5 Ghz.

FIG. 6D illustrates a table of data representing the electromagnetic characteristics of the synthesized component of FIG. 6C over a range of frequencies.

FIG. 6E includes a table that illustrates differences between the electromagnetic characteristics listed for the electromagnetic analysis data of FIG. 2 and the electromagnetic characteristics of the synthesized component listed in FIG. 6D.

FIG. 7 illustrates an embodiment of the invention implemented as digitally encoded instructions (logic) that inputs and processes electromagnetic analysis data.

FIGS. 8A-8C illustrate an embodiment of the invention implemented as a network accessible electronic circuit synthesis application.

DETAILED DESCRIPTION OF THE INVENTION

Figure 1:
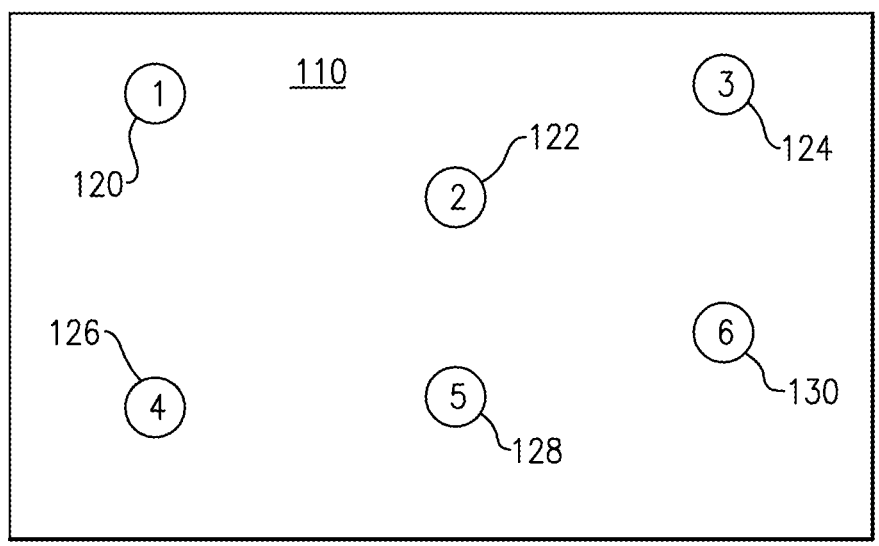
FIG. 1 illustrates a representation of at least a portion of an electronic circuit including a plurality of ports.

FIG. 1 illustrates a representation 110 of at least a portion of an electronic circuit including a plurality of ports 120-130. The representation 110, also referred to as a circuit representation 110, is referred to herein as being "opaque" because it does not illustrate content, scale or an arrangement of components of the associated circuit. Each port 120-130 is further identified using an index value (1-6) and represents a location within the electronic circuit 100 from which electromagnetic analysis data can be gathered.

Typically, a port represents two terminals, namely a signal terminal and a ground terminal. Often, but not always, ports share a same ground terminal. In some circumstances, an electronic circuit includes multiple non-equivalent ground terminals. As a result, an N-port circuit includes at least N signal terminals and at least (1) or more ground terminals. Hence, use of the term "port" is intended to refer to a signal terminal located at a location of the port within the electronic circuit and an associated ground terminal located somewhere in the electronic circuit.

For example, a typical 2-port electronic circuit will have three terminals, a signal terminal for port 1 and a signal terminal for port 2, and the ground terminal. Electronic components are connected between each pair of terminals located within the circuit. Thus, a 2-port electronic circuit is modeled with three electronic components, where at least one electronic component is located between each pairing of the (3) signal and ground terminals.

Figure 2:
FIG. 2 illustrates a table of electromagnetic analysis data including electronic coupling values as a function of frequency, between the first port and the second port of the electronic circuit of FIG. 1.

FIG. 2 illustrates a table 210 of electromagnetic analysis data including electromagnetic (measurement) coupling values as a function of frequency, between the first port 120 and the second port 122 of an electronic circuit 110 of FIG. 1. Each row of the table 210 includes (3) values, each value also residing within one of (3) columns 212-216, that represent a particular frequency (column 212) and that represent electromagnetic coupling between the first port 120 and the second port 122 (columns 214-216) occurring at and associated with the particular frequency (column 212).

Within each row of the table 210, the first (leftmost) value (Column 212) indicates a frequency expressed in units of gigahertz (Ghz), the second (middle) value (Column 214) indicates a conductance value (g) and the third (rightmost) value (Column 216) indicates a susceptance (b) value. The electromagnetic coupling associated with a particular frequency is represented by a combination of the conductance value (g) (Column 214) and the susceptance value (b) (Column 216).

An admittance coupling value (Y), also referred to as an admittance value, is another representation of electromagnetic coupling and is derived (determined) from the combination of the conductance (g) value and a susceptance (b) value. Hence, this combination of a conductance (g) value and a susceptance (b) value constitutes an admittance (Y) value.

An impedance coupling value (Z), also referred to herein as an impedance value, is yet another representation of electromagnetic (measurement) coupling and is derived as a reciprocal of an admittance coupling (Y) value. Like admittance, the impedance coupling value (Z) can also represent electromagnetic coupling between the first port 120 and the second port 122.

The conductance value (g), is also referred to as a "real" portion of the admittance coupling value (Y). The susceptance value (b), is also referred to as an "imaginary" portion of the admittance coupling value (Y). The relationship between an admittance (Y), a conductance (g) and a susceptance (b) is Y=g+jb where j equals the square root of (−1). The relationship between an impedance (Z), a resistance (r) and a reactance (x) is and Z=r+jx, also where j equals the square root of (−1).

As shown in table 210, the electromagnetic analysis data includes conductance and susceptance coupling values associated with frequencies at 1 Ghz frequency intervals located between 1 Ghz and 10 Ghz (Column 212). Associated with the 1 Ghz frequency, the conductance coupling value is equal to 0.014683 and the susceptance coupling value is equal to −0.02666. Associated with the 5 Ghz frequency, the conductance coupling value is equal to 0.010390 and the susceptance coupling value is equal to 0.074879. Associated with the 10 Ghz frequency, the conductance coupling value is equal to 0.010047 and the susceptance coupling value is equal to 0.121685.

Figure 3A:
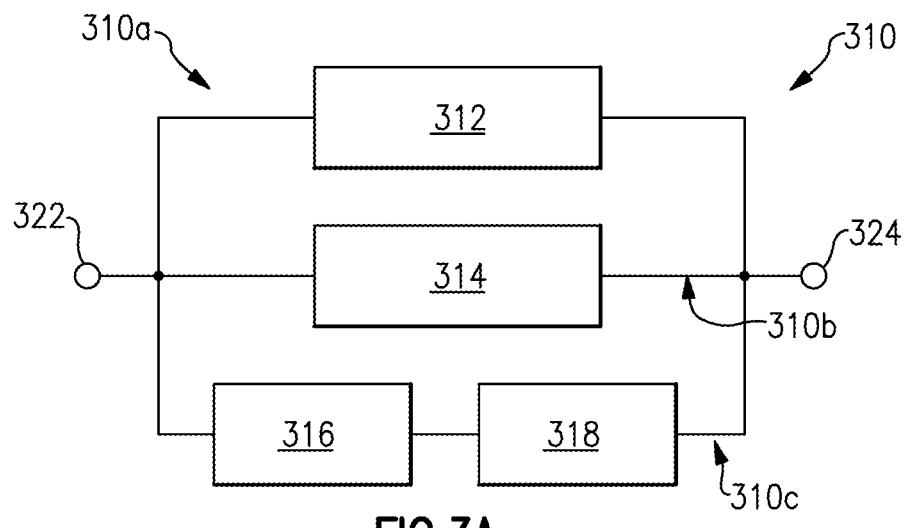
FIG. 3A illustrates an opaque (generic) element structure of a model electronic component including four elements.

FIG. 3A illustrates an opaque (generic) element structure of a model electronic component 310 including four elements. As shown, the opaque (generic) element structure includes a first element 312, a second element 314, a third element 316 and a fourth element 318. These (4) elements have not yet been assigned a particular electronic function (property), such as one of a resistance, inductance or capacitance, and as a result, are referred to herein as being opaque. Separately, each of these (4) elements can be assigned to function as a resistor, a capacitor or as an inductor. This opaque (generic) element structure is also referred to via an associated index identifier value (IX), and is also referred to as the IX component. As shown, the structure reveals the electrical connections between the opaque elements and conductive paths, but does not reveal any electronic properties assigned to the opaque elements as electrically connected to the conductive paths.

Figure 3B:
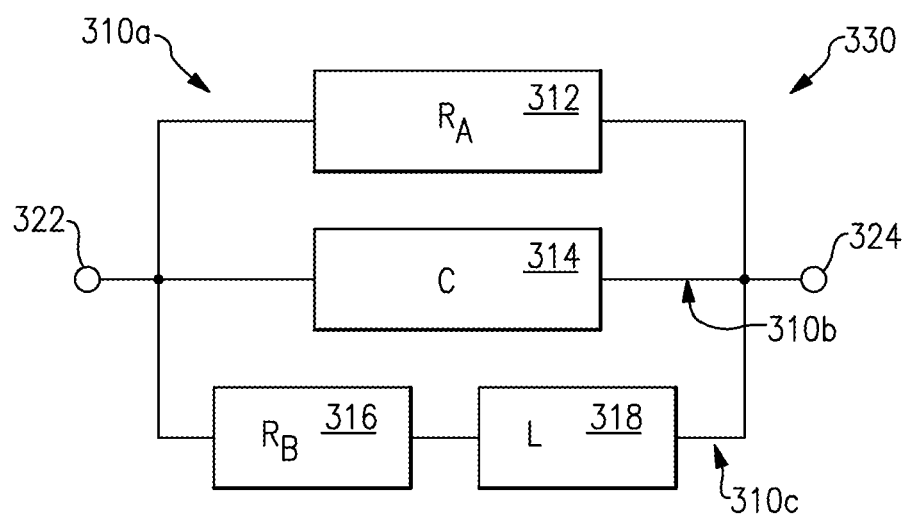
FIG. 3B illustrates a functional element structure 330 associated with the opaque (generic) element structure of the model electronic component of FIG. 3A where each element 312-318 is assigned to separately function as a particular element type, such as one of a resistor, a capacitor or an inductor.

FIG. 3B illustrates a functional element structure 330 associated with the opaque (generic) element structure of model electronic component 310 of FIG. 3A where each element 312-318 is assigned to separately function as a particular element type, such as one of a resistor, a capacitor or an inductor. As shown, the first element 312 is assigned to function as a resistor (Ra) 312, also referred to as a first resistor, the second element is assigned to function as a capacitor (C) 314, the third element is assigned to function as a resistor (Rb) 316, also referred to as a second resistor and the fourth element 318 is assigned to function as an inductor (L) 318.

The above described assignment of an electronic function (property) to each opaque (generic) element 312-318, also referred to as a functional arrangement, functional assignment pattern, or functional element structure is represented by the identifier "RCRL". The "RCRL" assignment pattern is also referred to via an associated index identifier value equal to (4), in order to distinguish it from other possible functional assignment patterns that can be applied to other (4) element components.

As a result, the component 330 of FIG. 3B is referred to as the IX-4 component. The IX-4 model component 330 of FIG. 3B is a functionally specific (non-opaque) version of the opaque (generic) element structure of IX model component 310 of FIG. 3A. The functional element structure "RCRL" of the component 330 of FIG. 3B does not specify a rating (amount of resistance) for any resistor, a rating (amount of capacitance) for any capacitor or specify a rating (amount of inductance) for any inductor residing within it. As yet, no amount of resistance, capacitance or inductance is assigned to any of the (4) elements if the IX-4 model electronic component.

In accordance with the invention, a rating, such as an amount of resistance (R) that is assigned to the first resistor (Ra) 312, or an amount of capacitance (C) that is assigned to the capacitor 314, or an amount of resistance (R) that is assigned to the second resistor (Rb) 316 or an amount of inductance (L) that is assigned to the inductor 318, is determined in response to a synthesis data portion of the electromagnetic analysis data of FIG. 2. The electromagnetic analysis data specifies an electromagnetic coupling, namely a separate amount of conductance (G) 214 and susceptance (B) 216 that is measured as residing within the electronic circuit between the first port 120 and the second port 122 of the electronic circuit 110, in association with each particular frequency 212.

Upon being synthesized (See FIG. 3D), the IX-4 component is configured to possess (yield) particular electromagnetic characteristics, specifically an amount of conductance (G) and susceptance (B) when a particular synthesis frequency is applied between its input port 322 and its output port 324, matching that specified by the electromagnetic analysis data of FIG. 2 that is associated with the same particular synthesis frequency.

A rating that is assigned to the first resistor 312, a rating that is assigned to the capacitor 314, a rating that is assigned to the second resistor 316 and a rating that is assigned to the inductor 318 configures (causes) the electronic component as a whole to yield (possess) an equal amount of conductance (G) and susceptance (B) as that residing between the first port 120 and the second port 122 of the electronic circuit 110 of FIG. 1, obtained in association with the same particular synthesis frequency. In summary, the synthesis data portion of the electromagnetic analysis data, having an associated set of synthesis frequencies, is employed to determine how to transform the model component (IX-4) of FIG. 3B, into the synthesized IX-4 component of FIG. 3D.

FIG. 3C illustrates a set of mathematical equations associated with the functional element structure of the model component 330 of FIG. 3B. Some of these equations are derived and dependent upon the functional element structure of the model component 330. The equations quantify a relationship between the functional element structure 330 and at least one electromagnetic coupling value. The at least one electromagnetic coupling value may be frequency dependent and quantified in association with a frequency.

A first equation (Equation 1) 340 has general application to electronic circuits. This equation 340 equates a variable (Y) representing an admittance value on its left hand side to an expression on its right hand side that is a summation of a variable (g) 340a representing a conductance value and a variable (b) 340b representing a susceptance value. The (j) identifier preceding the (b) variable indicates that the susceptance variable (b) is an imaginary quantity, as opposed to a real quantity. The conductance variable (g) is a real quantity and the admittance variable (Y) is a complex quantity, which is a combination of a real and an imaginary quantity. As applied to a model electronic component, the admittance (Y) provided (yielded) by an electronic component is the summation of the (real) conductance (g) and the (imaginary) susceptance (b) provided (yielded) by the electronic component 330.

The first equation 340 further equates the admittance value (Y) to a sum of a terms 340c and 340d. The terms 340a and 340c each represent the real portion of the admittance value (Y) and are equal to each other. The terms 340b and 340d each represent the imaginary portion of the admittance value (Y) and are equal to each other. The term 340c includes a combination of a resistance value (R) and a reactance value (X) provided by the component 330. The term 340d also includes a combination of a resistance value (R) and a reactance value (X) provided by the component 330.

A second equation (Equation 2) 342 applies the first equation 340 to the specific functional element structure of the component 330 of FIG. 3B. The second equation 342 further equates the admittance variable (Y) on the left hand side of the equation 342 to an expression on the right hand side of the equation 342. The right hand expression includes (3) terms 342a-342c that each represent an admittance associated with a parallel conductive path 310a-310c within the component 330. Each of the terms 342a-342c include variables that each represent a rating of each element 312-318 located within the functional element structure of the component 330 of FIG. 3B.

The term 342a includes the rating (Ra) of element 312 and represents the admittance provided by conductive path 310a. The term 342b includes the rating (C) of element 314 and represents the admittance provided by conductive path 310b. The term 342c includes the rating (Rb) and (L) of elements 316 and 318 respectively, and represents the admittance provided by conductive path 310c. The total admittance (Y) 342d associated with the component 330 equals the sum of an admittance associated with and represented by each of the terms 342a-342c.

The variable (Ra) represents a rating (amount of resistance) assigned to the first element (first resistor) 312. The variable (C) represents a rating (amount of capacitance) assigned to the second element (capacitor) 314. The variable (Rb) represents a rating (amount of resistance) assigned to the third element (second resistor) 316. The variable (L) represents a rating (amount of inductance) assigned to the fourth element (inductor) 318.

A third equation (Equation 3) 344 is derived (See FIG. 3F) from the second equation 342 and equates a left hand expression including (2) element rating variables (L and Rb) to a right hand expression including radian frequency (w1, w2), conductance (g1, g2)) and susceptance (b1, b2) data values obtained from the electromagnetic analysis data at (2) different radian frequencies. The left hand expression divides the inductance (L) of the fourth element 318 of the component 330 by the resistance (Rb) of the third element 316 of the component 330.

The right hand expression mathematically incorporates a susceptance (b1) associated with a first frequency and a susceptance (b2) associated with a second frequency, a conductance (g1) associated with the first frequency and a conductance (g2) associated with the second frequency, and a radian frequency (w1) associated with the first frequency (1 Ghz) and the radian frequency (w2) associated with the second frequency (10 Ghz). A radian frequency is equal to a frequency expressed in cycles per second multiplied by the number of radians (Approximately 6.28 radians per cycle).

A fourth equation (Equation 4) 346 is derived from equations 343a-343b (FIG. 3F) which are derived from equation 342 (See FIG. 3F) and equates the resistance (Rb) of the third element 316 of the component 330 with a right hand expression including various frequency, conductance and susceptance data values obtained from the electromagnetic analysis data and including the left hand expression (L/Rb) of the third equation 344. Solving for (L/Rb) via the third equation enables solving for (Rb) by itself via the fourth equation 346. Upon solving for (Rb), (L) is solved by multiplying (Rb) by (L/Rb).

The fifth equation (Equation 5) 348 is derived from a combination of the first equation 340 and the second equation 342 and depends on one radian frequency (w1). The sixth equation (Equation 6) 350 and the seventh equation (Equation 7) 352 are derived from the first equation 340 and the fifth equation 348. The sixth equation 350 isolates portions of the fifth equation 348 that contribute a real portion of the admittance (Y). The seventh equation 352 isolates portions of the fifth equation 348 that contribute an imaginary portion of the admittance (Y).

The sixth equation 350 equates a reciprocal of the resistance (1/Ra) of the first element 312 with a right hand expression including a radian frequency (w1) and a conductance data value (g1) obtained from the electromagnetic analysis data of FIG. 2 and including the element resistance rating variable (Rb) and the inductance rating variable (L) determined from solving of the fourth equation 346.

The term 350c is derived from term 340c and represents a real admittance (Y) contributed by the conductive path 310c that includes the resistor (Rb) and the inductor (L). The term 348b of the fifth equation 348, represents an admittance (Y) contributed by the conductive path 310b that includes only the capacitor 314. The capacitor 314 contributes only an imaginary portion of the admittance (Y). As a result, the term 348b is absent from the sixth equation 350.

The seventh equation 352 equates a left hand expression including the capacitance rating variable (C) of the second element 314 with a right hand expression including the radian frequency data value (w1) obtained from the electromagnetic analysis data of FIG. 2 and including the resistance rating variable (Rb) 316 of the third element and the inductance rating variable (L) 318 of the fourth element. The (Rb) and (L) variables are determined from solving of the third 344 and fourth equations 346.

The term 352a represents an imaginary portion of the admittance (Y) contributed by the conductive path 310b. The term 352b (b1) represents an imaginary portion of the admittance (Y) contributed by the conductive paths 310a-310c. The term 352c is derived from the expression of the term 340d and represents an imaginary portion of the admittance (Y) contributed by the conductive path 310c that includes the resistor (Rb) and the inductor (L). The term 348a of the fifth equation 348, represents an admittance (Y) contributed by the conductive path 310a that includes only the resistor 312. The resistor contributes only a real portion of the admittance (Y). As a result, the term 348a is absent from the seventh equation 352.

As a result, all (4) element rating variables, namely (Ra) 312, (C) 314, (Rb) 316 and (L) 318 can be determined (solved for) from the electromagnetic analysis data values, including the first (w1) and second (w2) radian frequency, first (g1) and second (g2) conductance, and first ( )) and second (b2) susceptance values. Details of the derivations of the above third and fourth equations 344-346 are provided in FIG. 3F.

Figures 3D, 3E:
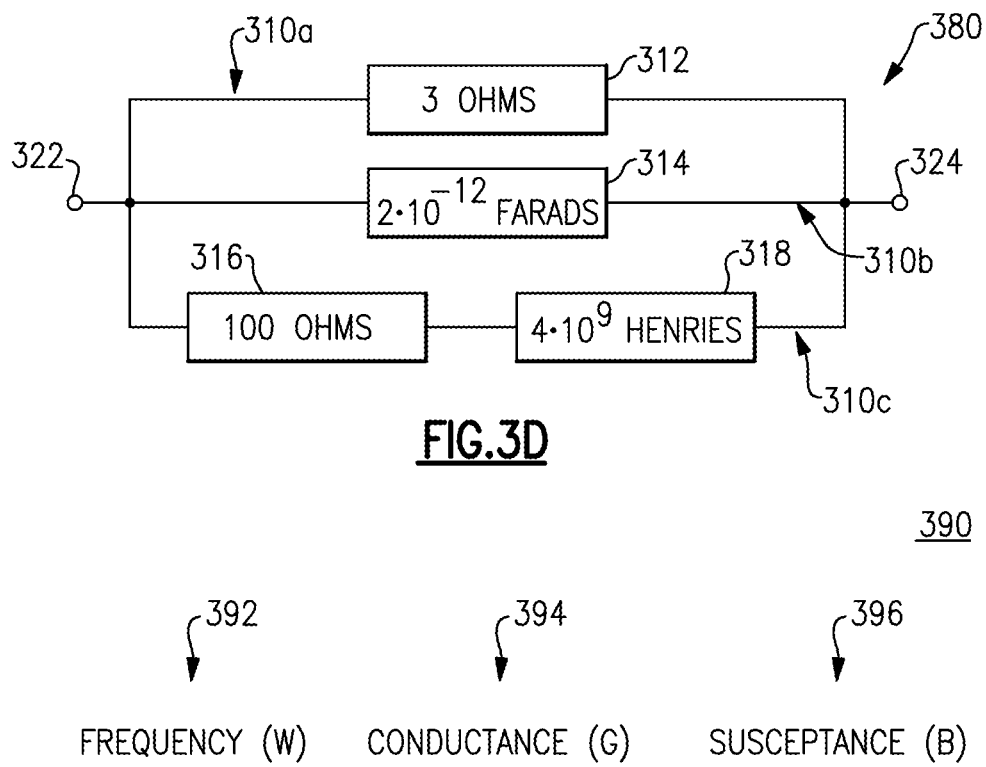
FIG. 3D illustrates a synthesized component that is configured with specific element rating values based upon the electromagnetic analysis data associated with selected synthesis frequencies of 1 Ghz and 10 Ghz.
FIG. 3E illustrates a table of data representing electromagnetic characteristics of the synthesized component of FIG. 3D.

FIG. 3D a synthesized component 380 that is configured with specific element rating values based upon the electromagnetic analysis data 210 associated with a set of selected synthesis frequencies consisting of 1 Ghz and 10 Ghz frequencies. The amount of resistance, capacitance or inductance that is assigned to each of the elements 312-318 of the IX-4 component is a function of the conductance and susceptance values associated with the 1 Ghz and the 10 Ghz frequencies, constituting synthesis data. The 1 Ghz and 10 Ghz frequencies are hereafter referred to as synthesis frequencies and the IX-4 component is synthesized in accordance with electromagnetic coupling values 210 associated with the 1 Ghz and 10 Ghz synthesis frequencies, constituting synthesis data.

Solving the third through seventh equations using the electromagnetic analysis data values associated with the synthesis frequencies of 1 Ghz and 10 Ghz yields a first element resistor rating of 3 Ohms, a second element capacitor rating of 2 (10-12) Farads, a third element resistor rating of 100 Ohms and a fourth element inductor rating of 4 (10-9) Henries.

As a result, the synthesized component of FIG. 3D provides a conductance value equal to 0.014683 and a susceptance value equal to −0.02666 when a 1 Ghz frequency electrical current is applied across its input port 322 and its output port 324, and provides a conductance value equal to 0.010047 and a susceptance value equal to 0.121685 when a 10 Ghz frequency electrical current is applied across its input port 322 and it output port 324.

In accordance with the invention and as demonstrated by the example described above, the electromagnetic characteristics of a large plurality of functional element (component) structures can be quantified and synthesized in a rapid and automated fashion, according to electromagnetic analysis data. Synthesized components are then evaluated and compared, in an automated fashion, with respect to their electromagnetic characteristics at non synthesis frequencies.

FIG. 3E illustrates a table 390 of data representing electromagnetic characteristics of the synthesized component 380 of FIG. 3D. Notice that the electromagnetic characteristics represent conductance (g) (Column 394) and susceptance (b) (Column 396) as a function of frequency (w) (Column 392), between the input port 322 and the output port 324 of the synthesized component 380. The structure of this table 390 is in accordance with the structure of the table 210 of FIG. 2.

FIG. 3F illustrates a derivation of the equations 344-346 of FIG. 3C. The second equation (Equation 2) 342 applies the first equation 340 to the specific functional element structure of the component 330 of FIG. 3B. Intermediate equations 343a-343b are derived from equation 342. Equation 344 is derived using the intermediate equations 343a-343b. As illustrated by the content of FIGS. 3C and 3F, for each functional element structure, an associated set of equations are derived that determine element rating values of the functional element structure in accordance with electromagnetic analysis data.

Figure 4A:
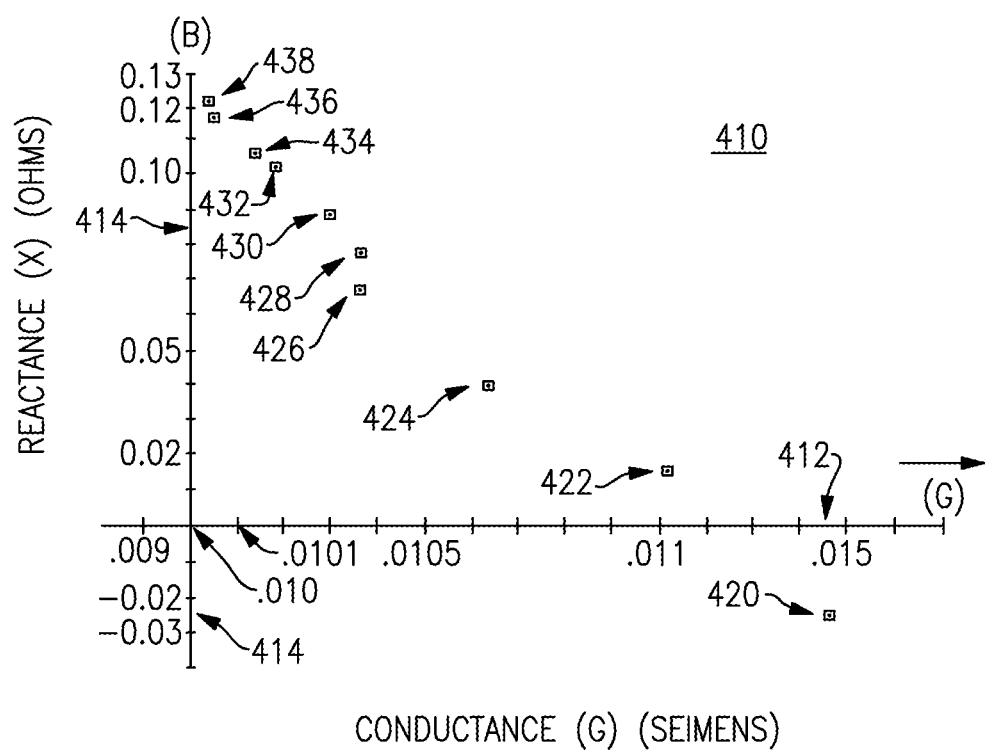
FIG. 4A is a graph illustrating the electromagnetic analysis data of the table of FIG. 2.

FIG. 4A is a graph 410 illustrating the electromagnetic analysis data of the table 210 of FIG. 2. The horizontal axis 412 represents conductance (G). The vertical axis 414 represents reactance (B). The horizontal axis representing conductance has (2) linear ranges. The first (leftmost) linear range is from a lowest conductance value equal to (0.009) to a higher conductance value equal to (0.011). A second (rightmost) linear range along the horizontal axis is from the second conductance value of (0.011) to a higher conductance value of (0.015). The vertical axis includes one linear range from a lowest susceptance value of (−0.03) to a highest susceptance value equal to (0.13).

Each data point on the graph 410 represents an electromagnetic data value. Each electromagnetic data value includes a combination of a conductance value and a susceptance value that are each associated with a particular frequency. A data point 420 that is associated with a frequency of 1 Ghz and represents a conductance value equal to (0.014683) and a reactance value equal to (−0.02666). The data point 438 that is associated with a frequency of 10 Ghz represents a conductance value equal to (0.010047) and a reactance value equal to (0.121685). The above described data points 420 and 438 are each associated with the lowest and highest frequencies respectively, and are referred to herein as exterior or outside (end) data points. Other data points 422-436 are associated with the frequencies that are separated at 1 Ghz intervals and that reside at or between the 2 Ghz through 9 Ghz frequencies. The other data points 422-436 are collectively referred to as interior data points.

Figure 4B:
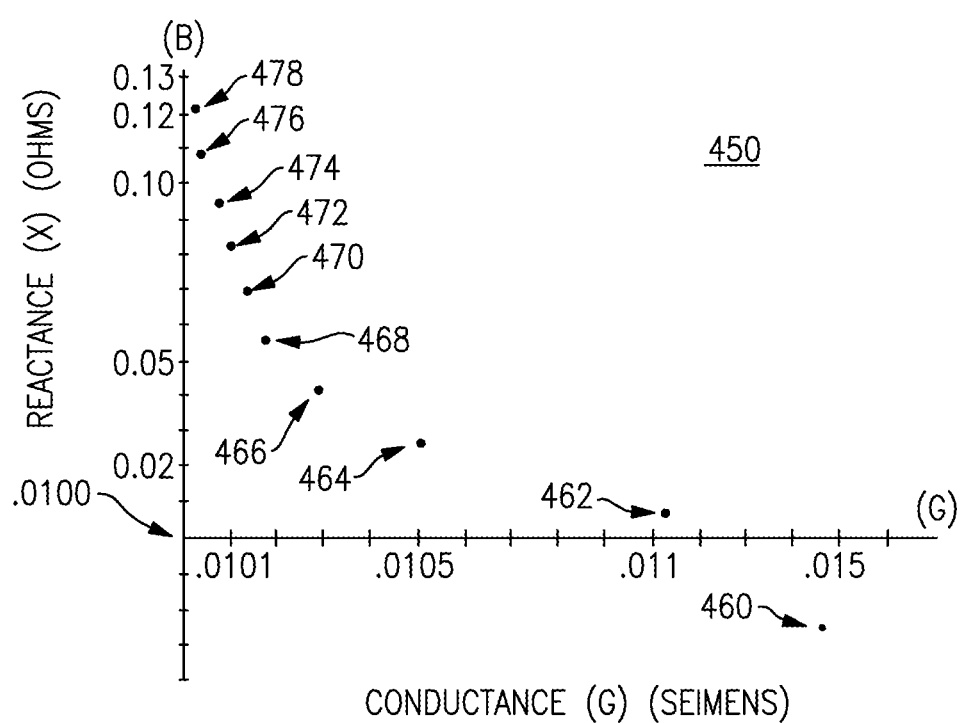
FIG. 4B is a graph illustrating the electromagnetic characteristics of the synthesized components that are listed within FIG. 3E.

FIG. 4B is a graph 450 illustrating the electromagnetic characteristics of the synthesized component 380 that are listed 390 within FIG. 3E. This graph has the same horizontal axis and vertical axis as in FIG. 4A. The data point 460 is associated with a frequency of 1 Ghz includes a conductance value equal to (0.014683) and a reactance value equal to (−0.02666). The data point 478 is associated with a frequency of 10 Ghz and includes a conductance equal to (0.010047) and a reactance value equal to (0.121685).

The data points 460 and 478 of FIG. 4B respectively correspond to (are respectively associated with the same frequency as) the data points 420 and 438 of FIG. 4A. A pairing of the data points 460 and 420, constitute an example of a corresponding pair of data points. Likewise, a pairing of data points 462 and 422 and a pairing of the data points 468 and 428, also each constitute an example of a pairing of corresponding points.

Notice that the graph location of the data points 460 and 478 of FIG. 4B respectively match the graph location of the data points 420 and 438 of FIG. 4A. The data points 420 and 438 (FIG. 4A) comprise the synthesis data portion of the electromagnetic analysis data. Hence, the data point 460 of FIG. 4B represents a conductance value and a susceptance value equal to that of data point 420 of FIG. 4A and the data point 478 represents a conductance value and a susceptance value equal to that of data point 438 of FIG. 4B.

The equivalence of these (2) pairs of corresponding data points is a result of each pair of corresponding data points being associated with the synthesis data portion of the electromagnetic analysis data and a synthesis frequency of either 1 Ghz or 10 Ghz. The synthesized component 390 is configured to have electromagnetic characteristics matching the synthesis data portion of the electromagnetic analysis data which is associated with the synthesis frequencies of 1 Ghz and 10 Ghz.

Unlike the exterior data points of FIG. 4A, the location of each of the interior data points 462-466 of FIG. 4B, are not equivalent to the location of each of the interior data points 422-436 of FIG. 4A. Because the interior data points 462-476 of FIG. 4B are not associated with the synthesis data and a synthesis frequency of either 1 Ghz or 10 Ghz, the synthesized component 390 is not synthesized to provide electromagnetic characteristic data points 462-476 (FIG. 4B) matching the data points 422-436 (FIG. 4A) of a non-synthesis data portion of the electromagnetic analysis data associated with non-synthesis frequencies.

Alternatively, the synthesized component 390 can be synthesized according to other data points 422-326 that are associated with one or more frequencies that are not equal to the current synthesis frequencies of 1 Ghz and 10 Ghz. For example, the component 390 can be synthesized according to any (2) different frequencies associated with the electromagnetic analysis data of FIG. 2. For example, the (2) different synthesis frequencies can be 4 Ghz and 8 Ghz, 3 Ghz and 4 Ghz, 2 Ghz and 9 Ghz etc.

FIG. 4C includes a table 480 that illustrates one embodiment of a method of measuring (quantifying) differences between the electromagnetic characteristics of the synthesized component 380 of FIG. 3D and the electromagnetic characteristics of the electromagnetic analysis data of FIG. 2. The electromagnetic characteristics of FIG. 3D are listed in FIG. 3E and graphically represented in FIG. 4B. The electromagnetic characteristics of FIG. 2 are graphically represented in FIG. 4A.

In this embodiment, the differences between these (2) data sets are measured by measuring a difference between each data point of FIG. 4B and a corresponding data point of FIG. 4A. A corresponding data point is a data point of one data set that is associated with the same frequency as that of a data point of another data set. For example, data point 632 of FIG. 4A and data point 672 of FIG. 4B are both associated with the same frequency of 7 Ghz.

For each pair of corresponding data points, also referred to as a corresponding pair, any difference between the conductance value of each data point of the corresponding pair is squared, any difference between the susceptance value of each data point of the corresponding pair is squared, and the aforementioned squared difference in the conductance values and the squared difference in the susceptance values are summed (added) together to determine a sum of squared differences for each corresponding pair of data points, also referred to as a difference value for each corresponding pair.

Each sum of squared differences for each corresponding pair of data points is summed (added) to determine a sum of squared differences for all corresponding pairs of data points, also referred to as a proximity value for all of the corresponding pairs. The proximity value represents a mathematical measure of the proximity between all data points of the first data set of FIG. 4A and the second data set of FIG. 4B.

The above described embodiment (method) for measuring (quantifying) differences between two or more sets of data, such as data representing electromagnetic characteristics, is just one of many embodiments (methods) that would be apparent to one skilled in the art. For example, in another embodiment, the absolute value of the differences, instead of the squared differences, are summed to measure (quantify) proximity between two sets of electromagnetic analysis data.

In other embodiments, differences between the inverted admittance (i.e., impedance) are instead measured (quantified) to determine proximity. Or in other embodiments, admittance values are converted into a reflection coefficient (Gamma=δ=(1−Y)/(1+Y)) and proximity is instead measured (quantified) using differences between the reflection coefficients of corresponding data points. The embodiment described below, is just one of many foreseeable methods that could be used to accomplish the same objective of quantifying differences between sets of data.

The sum of squared differences that is computed for each corresponding pair is a weighted mathematical representation of the proximity of the electromagnetic characteristics of a synthesized electronic component relative to the electromagnetic characteristics of the electromagnetic analysis data.

As shown in this table 480, frequency values are listed in column 482, a difference in conductance values of a corresponding pair of data points is listed in column 484, a difference in susceptance values of a corresponding pair of data points is listed in column 486, and a sum of a squared difference of the conductance values and of a squared difference of the susceptance values for each listed frequency is listed in column 488. The values listed in the column 488 are proximity values for each corresponding pair. A total sum of the sum of squared differences of column 488 is indicated by a value 490.

The value 490 is a measure of proximity between the electromagnetic characteristics provided by a synthesized component and the electromagnetic analysis data.

There are no differences between the electromagnetic characteristics provided by a synthesized component and the synthesis data portion of the electromagnetic analysis data.

All differences between the electromagnetic characteristics provided by a synthesized component and the electromagnetic analysis data are accounted for from the non-synthesis data. As shown, the conductance and susceptance differences associated with the synthesis frequencies equal 0.00000000. The smaller the value 490 is, the more proximate the electromagnetic characteristics provided by a synthesized component match a corresponding set of electromagnetic data.

In accordance with the invention, the component 390 can be synthesized with respect to other synthesis frequencies of a corresponding set of electromagnetic data, and as a result, provide electromagnetic characteristics that provide closer proximity to a corresponding set of electromagnetic data, as measured by the above described embodiment to measure proximity.

In other embodiments, susceptance and conductance values for each data point are converted to an admittance (Y) value for that data point. Differences between an admittance value (Y) for each of a corresponding pair of data points are determined and weighted. In yet other embodiments, each admittance value (Y) for each data point is converted to an impedance (Z) value for that data point. Differences between an impedance value (Z) for each data point are determined and weighted.

In the aforementioned described embodiments, differences between corresponding data points are further weighted by squaring those differences. In other embodiments, those differences can be summed across all corresponding pairs without further weighting via squaring.

Also in accordance with the invention, different components having different opaque (generic) and/or functional element structures can be synthesized with respect to the same synthesis frequencies (1 Ghz and 10 Ghz) or synthesized according to other frequencies that are selected as synthesis frequencies. Each synthesized electronic component yields electromagnetic characteristics having a measurable proximity to a corresponding set of electromagnetic analysis data. The measured proximity across all synthesized components is likely to vary. A synthesized component yielding a closest proximity to a non-synthesis data portion of corresponding electromagnetic data, as compared to farther and varying proximities of other synthesized components, are efficiently identified in an automated fashion.

As a result, in accordance with the invention, more accurate (proximate) synthetic component solutions can be identified faster than synthetic component solutions provided by the prior art.

Figure 5A:
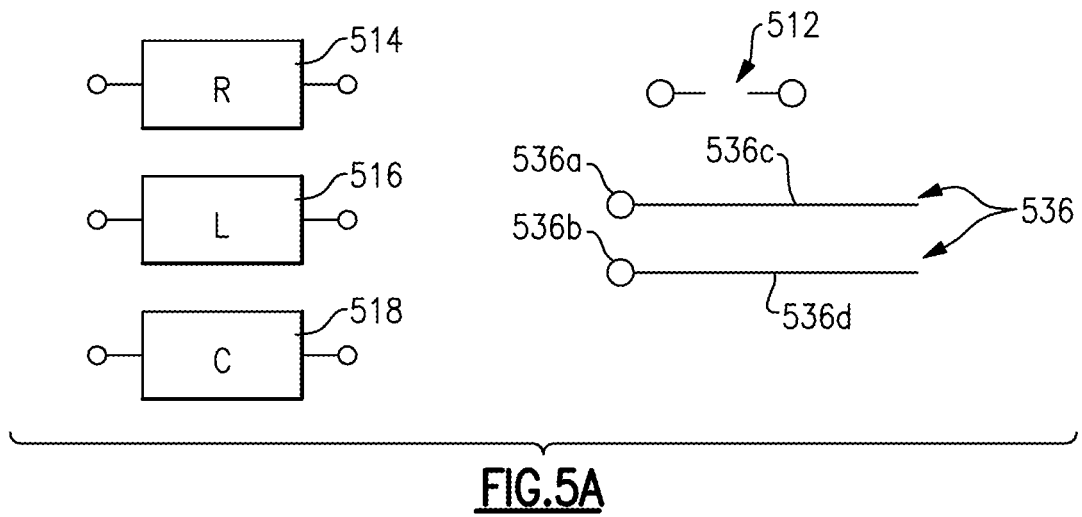
FIG. 5A illustrates (3) one element functional element structures (components) and a zero element component.
Figure 5B:
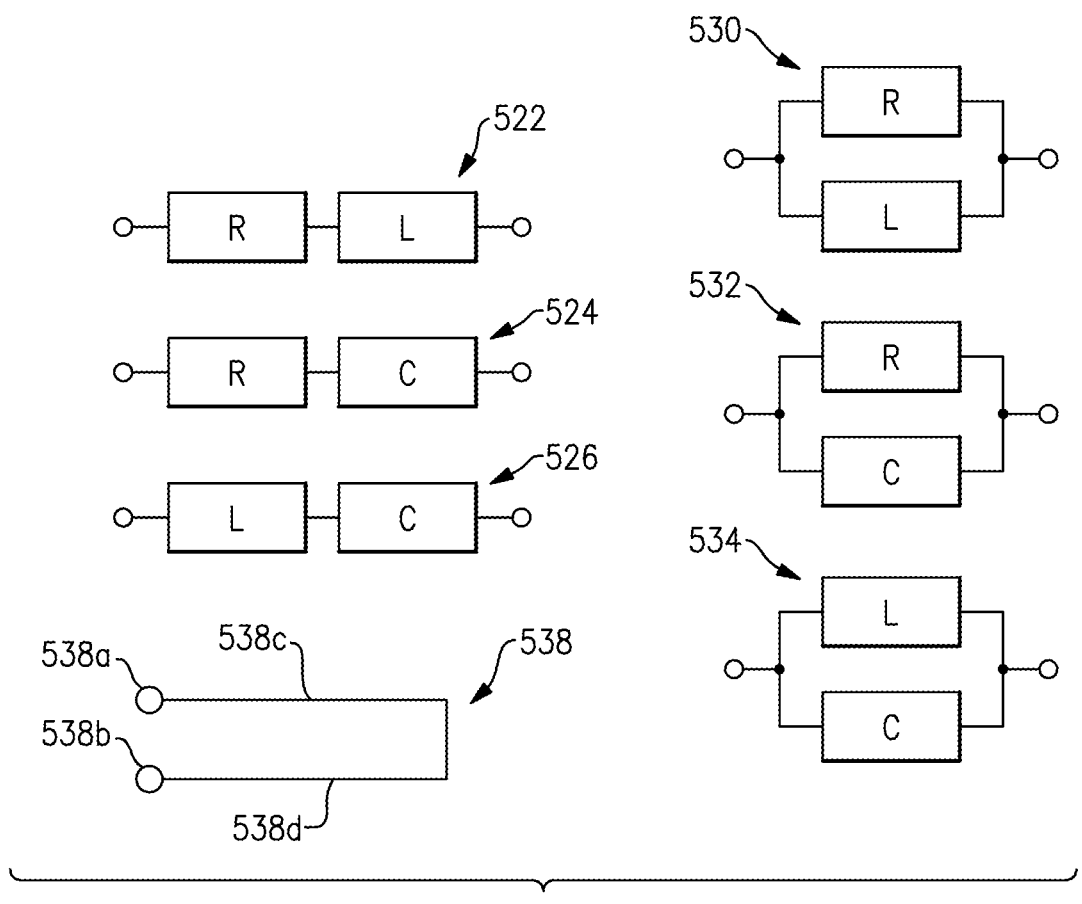
FIG. 5B illustrates (6) two element function component structures.

FIGS. 5A-5D illustrate a variety of opaque (generic) and/or functional element component structures from which a component can be synthesized in an accurate and automated fashion. FIG. 5A illustrates (3) one element functional element structures (components) 514-516 and a zero element component 512, an open circuited transmission line 536, also referred to as an open circuited stub 536. FIG. 5B illustrates (6) two element function component structures 522-526 and 530-534 and a short (closed) circuited transmission line 538, also referred to as a short (closed) circuited stub 538.

FIG. 5C illustrates (4) three element opaque (generic) element structures 540 of a model component that can be further configured into one of various functional element structures. A (3) element opaque (generic) element structure includes elements that are each indexed using the identifiers 1, 2 and 3 respectively. A resistor (R), capacitor (C) and an inductor (L) can be respectively assigned to elements indexed as 1, 2 and 3 respectively. This assignment is indicated by a text string of letters "RLC".

For the opaque (generic) element structures 542 and 544, other functional assignments indicated by the text strings such as "RCL", "LCR", "LRC", "CRL", "CLR" do not yield functional arrangements (functional element structures) that function differently for the component as a whole, and are said to be equivalent with each other. For example, with respect to component 542, as resistor (R) assigned to element number 1 in parallel with an inductor (L) assigned to element number 2 in parallel with a capacitor (C) assigned to element number 3, functions the same as a "CLR" functional arrangement where the same capacitor (C) assigned to element number 1 which is in parallel with the same inductor (L) assigned to element number 2 in parallel with the same resistor (R) assigned to element number 3.

The above described equivalence between different functional arrangements for the structures 542 and 544 is not necessarily true with respect to different functional arrangements for either structure 546 and 548. For example, a resistor in parallel with an inductor and capacitor in series does not yield the same electromagnetic characteristics as the same inductor in parallel with the same capacitor and same resistor in series.

Hence, the functional arrangements "RRL", "RRC", "RLC", "LRL", "LRC", "LLC", "CRL", "CRC", "CLC", are not equivalent and are referred to as being functionally distinct.

FIG. 5D illustrates (8) four element opaque (generic) element structures 560 that can be each further configured (specified) into one of various functional element structures (arrangements). A (4) element opaque (generic) structure includes elements that are each indexed using the identifiers 1, 2, 3 and 4 respectively. For example, a resistor (R), capacitor (C), another resistor (R) and an inductor (L) can be assigned to elements indexed as numbers 1, 2, 3 and 4 respectively. This functional assignment (functional element structure) is indicated by a text string of letters "RCRL".

Functionally distinct arrangements for components 562 and 564 include "RRLC", "LRLC" and "CRLC".

Functionally distinct arrangements for the components 566 and 568 include "RLRL", "RLRC", "RLLC", "RCRC", "RCLC" and "LCLC".

Functionally distinct arrangements for the components 570 and 572 include "RLRL", "RLRC", "RLLC", "RCRL", "RCRC", "RCLC", "LCRL", "LCRC", and "LCLC".

Functionally distinct arrangements for the components 574 and 576 include "RRRL", "RRRC", "RRLC", "RLRL", "RLRC", "RLLC", "RCRL", "RCRC", "RCLC", "LRRL", "LRRC", "LRLC", "LLRL", "LLRC", "LLLC", "LCRL", "LCRC", "LCLC", "CRRL", "CRRC", "CRLC", "CLRL", "CLRC", "CLLC", "CCRL", "CCRC" and "CCLC".

In some embodiments, the invention is implemented as a software program executing on a central processing unit (CPU) that is configured to perform the method of electronic circuit modeling described herein. In some embodiments, the software is implemented as a process executing within an operating system.

In this type of embodiment, the electromagnetic analysis data 210 of FIG. 2 and the functional and opaque (generic) element structure of model components of FIGS. 5A-5D are encoded digitally, such as within one or more files or data bases that are accessible from the operating system. The software program outputs selected synthesized components associated with associated portions of the electromagnetic analysis data 210.

Referring to FIG. 5A, a zero element component is simply an open circuit. An open circuited transmission line 536 has a first terminal (end) 536a and a second terminal (end) 536b. The first terminal 536a that is physically and electrically connected to a transmission line (wire) 536c and the second terminal 536b that is physically and electrically connected to a transmission line (wire) 536d, each have a separate connection to the electronic circuit 110. Typically each connection is to one of two terminals of an electronic component 110 that is located within the electronic circuit 110. The first terminal 536a and the second terminal 536b are not physically connected with each other.

However, because of the effects of mutual inductance and capacitance between the two transmission lines (wires) 536c and 536d wires, current can flow between the two transmission lines (wires) 536c and 536d at frequencies greater than zero cycles per second. Current having a frequency of zero cycles per second constitutes direct current (DC) and hence, no current will flow between the two transmission lines (wires) 536c and 536d when employing direct current. Electromagnetic analysis data is typically obtained in association with frequencies greater than zero cycles per second and as a result, an open circuited transmission line 536 can provide an electromagnetic characteristic (effect) that can be measured and synthesized.

Referring to FIG. 5B, a short (closed) circuited transmission line 538 has a first terminal 538a and a second terminal 538b. Like the open circuited transmission line 536, the first terminal 538a and the second terminal 538b of the short circuited transmission line 538 each have a separate connection to the electronic circuit 110 and typically, each connection is to one of two terminals of an electronic component 110 that is located within the electronic circuit 110. As a result, current can flow between the terminals 538a-538b and through the short circuited transmission line 538 when a voltage potential located at the first terminal 538a is not equal to a voltage potential located at the second terminal 538b.

A transmission line, whether it is an open circuited 536 or short (closed) circuited 538 transmission line, provides electromagnetic characteristics like other electronic model components.

Generally, a transmission line stub, whether an open circuited stub 536 or a short (closed) circuited stub 538, provides a mixture of series inductance along the length of the wires 536c-536d, and shunt capacitance between the wires 536c-536d, that constitute each of the transmission lines 536 and 538. An open circuited transmission line stub 536, appears at low frequency to function as a capacitor. As drawn, each of the two wires 536c-536d, that are oriented parallel to each other and that are each respectively connected to a terminal 536a, 536b, appear to function as a capacitor plate. Conversely, a short circuited transmission line stub 538, appears at low frequency to function as an inductor. Hence, both types of transmission line stubs 536, 538 function as a frequency dependent electronic component. A transmission line stub 536, 538 can be designed and incorporated into the electronic circuit 110 to function as a frequency dependent electronic component.

A characteristic amount of impedance (Z0) and admittance (Y0) associated with a transmission line 536, 538 is a function of its geometry, including its cross-section size. An actual amount of impedance (Z) and admittance (Y) is further a function of the length of the transmission line 536, 538.

FIG. 5E illustrates equations that are employed to determine the actual impedance of an open circuited 536 or short (closed) circuited 538 transmission line. Referring to equation 580a the actual impedance (Z) provided by an open circuited transmission line is a function of the characteristic impedance (Z0) and a cotangent of an angle (a), which is a function of the length (l) of the transmission line. Referring to equation 580b the actual admittance (Y) provided by an open circuited transmission line is a function of the characteristic impedance (Y0) and a tangent of an angle (a), which is a function of the length (l) of the transmission line. The angle (a) is determined by dividing the length (l) of the transmission line by an electrical length (L), and then multiplying by 360 degrees. The electrical length (L) equal to a wavelength associated with a frequency of a signal traveling over the transmission line.

For example, a 1 Ghz frequency has a wavelength of approximately 0.3 meters (30 centimeters). If a open circuited transmission line has a length of 0.3 centimeters, then the length (l) of the transmission line is (l/L)=(0.3/30) centimeters=0.01, or 1% of the electrical length. The angle (a) is (l/L) multiplied by 360 degrees=3.6 degrees. The actual impedance of a transmission line of 0.3 centimeters equals Z0 multiplied by the cotangent of 3.6 degrees. Where the characteristic impedance (Z0) equals 50 ohms, the actual impedance of the open circuited transmission line equals (50 ohms) *ctn (3.6 degrees)=−794.72 ohms (imaginary). The actual admittance of a transmission line of 0.3 centimeters equals Y0 multiplied by the tangent of 3.6 degrees. Where the characteristic admittance (Y0) equals 0.2 seimens, the actual admittance of the open circuited transmission line equals (0.2 seimens)*tan(3.6 degrees)=0.01258 seimens (imaginary).

Referring to equation 590a, the actual impedance (Z) provided by a short (closed) circuited transmission line is a function of the characteristic impedance (Z0) and a tangent of an angle (a). Referring to equation 590b, the actual admittance (Y) provided by a short (closed) circuited transmission line is a function of the characteristic impedance (Y0) and a cotangent of an angle (a). The angle (a) is the same function of the length (l) of the transmission line and the electrical length (L) as previously described.

For example, a 1 Ghz frequency has a wavelength of approximately 0.3 meters (30 centimeters). If a short (closed) circuited transmission line has a length of 0.3 centimeters, then the length (l) of the transmission line is (l/L)=(0.3/30) centimeters=0.01, or 1% of the electrical length. The angle (a) is (l/L) multiplied by 360 degrees=3.6 degrees. The actual impedance of a transmission line of 0.3 centimeters equals Z0 multiplied by the tangent of 3.6 degrees. Where the characteristic impedance (Z0) equals 50 ohms, the actual impedance of the open circuited transmission line equals (50 ohms)*tan (3.6 degrees)=3.145 ohms (imaginary). The actual admittance of a transmission line of 0.3 centimeters equals Y0 multiplied by the cotangent of 3.6 degrees. Where the characteristic admittance (Y0) equals 0.02 seimens, the actual admittance of the open circuited transmission line equals (0.02 seimens)*ctn (3.6 degrees)*(−1)=−0.3178 seimens (imaginary).

The impedance and admittance values determined above are imaginary because the equations 580a-580b and 590a-590b model the transmission line stubs as providing the electromagnetic characteristics of inductance and/or capacitance which are each classified as imaginary. But a lossy transmission line stub 536, 538 further provides resistance which is classified as real, in addition to the inductance and capacitance which are classified as imaginary.

As a result, the electromagnetic characteristics provided by the transmission line stubs can include both real and imaginary components and as a result, are represented by a complex number, also referred to herein as being complex. Hence, in this type of circumstance, the angle (a), Z0, Y0 and the tangent or cotangent of the angle (a) are also represented by a complex number.

FIG. 6A illustrates a two element function component structure 630 that is also illustrated as component 532 in FIG. 5B. This component 630, also referred to as a parallel RC circuit, will be synthesized as a second candidate component in addition to the synthesized component 330 of FIG. 3B.

The component 630 includes an input port (terminal) 622, an output port (terminal) 624 and two parallel conductive paths 632 and 634 connecting the input port 622 with the output port 624. A first parallel conductive path 632 includes only a resistor 612. A second parallel conductive path 634 includes only a capacitor 614. This model electronic component 630 can be synthesized as follows.

Applying the first equation 340 of FIG. 3C, the admittance (Y) provided by the component 630 equals a sum of the conductance (g) and susceptance (b) provided by the component 630. The admittance (Y) provided by the component 630 also equals the sum of the admittance (Y) provided by the first parallel conductive path 632 and the admittance (Y) provided by the second parallel conductive path 634.

The first conductive path 632 includes only a pure resistor 612 and consequently provides conductance without susceptance. The second conductive path 634 includes only a pure capacitor 614 and consequently provides susceptance without resistance.

FIG. 6B illustrates a set of mathematical equations associated with the functional element structure of the model component 630 of FIG. 6A. These equations are derived and dependent upon the functional element structure of the model component 630.

Equation 640 equates an admittance value (Y) to a sum of a conductance value (g) and a susceptance value (b) (See Equation 340) and further equates the admittance value (Y) to a right hand side expression including a sum of separate terms 642 and 644. The term 642 is real and represents the conductance (g) provided by the first conductive path 632 and is expressed as a reciprocal of a rating of the resistor 612 (1/R). The term 644 is imaginary and represents the susceptance (b) provided by the second conductive path 634 and is expressed as a rating of the capacitor 614 multiplied by a radian frequency (w).

In order to synthesize the component 630, only one conductance value (g) is required to solve for the rating of the resistor 612 and only one susceptance value (b) in combination with an associated frequency is required to solve for the rating of the capacitor 614.

Referring to table 210 of FIG. 2, each and all of the ten data points listed within the table 210 includes an associated conductance value (g) 214 and a susceptance value (b) 216. Hence, any one of the (10) data points of FIG. 2 can be employed to synthesize the component 630. Furthermore, a conductance value (g) from any one of the (10) data points in combination with a susceptance value (b) from any other one of the (10) data points can be employed to synthesize the component 630.

Opting to synthesize the component 630 by selecting the electromagnetic analysis data point associated with the 1 Ghz frequency as synthesis data, yields a resistor rating of 68.11 Ohms and a capacitor rating equal to −4.243 (10-12) Farads.

Opting to synthesize the component 630 by selecting the electromagnetic analysis data point associated with the 5 Ghz frequency, yields a resistor rating of 96.25 Ohms and a capacitor rating equal to 2.383 (10-12) Farads.

Opting to synthesize the component 630 by selecting the electromagnetic analysis data point associated with the 10 Ghz frequency, yields a resistor rating of 99.53 Ohms and a capacitor rating equal to 1.937 (10-12) Farads.

FIG. 6C illustrates a synthesized component 680 that is configured with specific element rating values based upon the electromagnetic analysis data associated with selected synthesis frequencies of 5 Ghz. Accordingly, the synthesized component 680 provides a conductance value equal to 0.010190 and a susceptance value equal to 0.054879 when a 5 Ghz frequency electrical current is applied across its input port 622 and its output port 624.

FIG. 6D illustrates a table 690 of data representing the electromagnetic characteristics of the synthesized component 680 of FIG. 6C over a range of frequencies. The electromagnetic characteristics represent conductance (g) and susceptance (b) as a function of frequency (w), between the input port 622 and the output port 624 of the synthesized component 680. The structure of this table 690 is in accordance with the structure of the table 210 of FIG. 2.

FIG. 6E includes a table 692 that illustrates differences between the electromagnetic characteristics listed for the electromagnetic analysis data of FIG. 2 and the electromagnetic characteristics of the synthesized component 680 listed FIG. 6D.

As shown, the differences listed are larger than the differences listed for the synthesized component 380 that are listed in FIG. 4C. The sum of the squared differences listed for the synthesized component 680 equals 0.00331940 and the sum of the squared differences listed for the synthesized component 380 equals 0.00200012. Hence, the electromagnetic characteristics of the synthesized component 380 have closer proximity to the electromagnetic characteristics of the electromagnetic analysis data listed table 210 of FIG. 2.

In other embodiments, the conductance associated with one frequency, such as a 1 Ghz frequency and the susceptance associated with another frequency, such as a 10 Ghz frequency, can be selected and combined as synthesis data.

Alternatively, conductance values and susceptance values of multiple data points can be averaged. Or alternatively, electronic properties of a synthesized component 680 can be separately determined from each of more than one set of synthesis data and can then be averaged.

For example, with the 1 Ghz frequency as synthesis data, the electronic properties of component 680 are synthesized to equal a resistor rating of 68.11 Ohms and a capacitor rating equal to −4.243 (10-12) Farads. Selecting the 10 Ghz frequency as synthesis data, the electronic properties of component 680 are synthesized to equal a resistor rating of 99.53 Ohms and a capacitor rating equal to 1.937 (10-12) Farads. The electrical properties can be averaged to determine an average resistor rating equal to (68.11+99.53)/2=83.82 ohms and a capacitor rating equal to −2.306 (10-12) Farads.

Model electronic components with far more than 4 elements can be modeled and synthesized employing sufficient synthesis data to solve associated equations that are derived in association with the functional element structure of each model electronic component. Sufficient synthesis data depends upon the functional element structure of each model electronic component. It is possible to synthesize components including two elements from real and imaginary electromagnetic data associated with one frequency, or from real electromagnetic data associated with two frequencies, or from imaginary electromagnetic data associated with two frequencies.

For the functional element structure 330 described in FIG. 3B, real and imaginary electromagnetic data associated with two frequencies is sufficient, as illustrated by the equations of FIG. 3F. Employing equations to model the electromagnetic characteristics of each functional element structure, like that shown in FIG. 3F, provides information as to what types and associated frequencies of electromagnetic analysis data, will be sufficient to constitute synthesis data, that is employed to synthesize each functional element structure into a synthesized component.

Some functional element structures are less flexible with respect to what constitutes sufficient synthesis data. For example, a functional element structure including (4) non-resistor elements (no resistors), generally, imaginary electromagnetic data associated with four frequencies is required to constitute sufficient synthesis data. Each of the (4) elements are designed to provide non-real (imaginary) electromagnetic characteristics and hence, the real portion of the electromagnetic characteristics provided by this functional element structure is expected to be zero in association with all frequencies. Consequently, the real portion of the real and imaginary electromagnetic analysis data associated with just two frequencies is not sufficient and such data provides only half of the imaginary electromagnetic analysis data required to synthesize (assign ratings) to all of the (4) non-resistor elements.

FIG. 7 illustrates an embodiment of the invention implemented as digitally encoded instructions (logic) 710 that inputs and processes electromagnetic analysis data 712. As shown, digital logic 710, such as encoded within software 710, is employed to construct an electronic circuit model 716 in accordance with the invention. The digital logic 710 is configured to input electromagnetic analysis data 712 and to output a representation of an electronic circuit model 716 in accordance with the invention described herein. The digital logic 710 also inputs and employs representations of opaque (generic) and/or functional element structures and their associated information including mathematical equations 714 in order to synthesize electronic components in response to the electromagnetic analysis data 712.

In some embodiments, the data and/or representation of the electronic circuit model are stored as files, such as Microsoft Windows operating system compliant files, onto one or more persistent storage devices. In some embodiments, the digital logic can be implemented as a process executing on an operating system, such as the Microsoft Windows operating system or the UNIX operating system, for example.

Some embodiments of this approach might be characterized as an efficient automation of one or more known methods given the similarity of input (electromagnetic analysis data) and output (an electronic circuit model), however, the efficient automation provided by the invention includes techniques as claimed and/or described that are not known to be employed as part of any known manual method or automated method, and as a result, can generally yield accuracy and efficiency far beyond what can be accomplished with known manual and/or automated methods.

Summarizing some of the aspects of the invention, in some embodiments, the invention provides for a method for electromagnetic modeling of an electronic circuit, comprising the steps of obtaining electromagnetic analysis data associated with at least a first port and a second port of an electronic circuit, the data including a set of one or more electromagnetic coupling values that each represent at least one electromagnetic characteristic that is associated with a location between the first port and the second port, providing a set of one or more model electronic components, each of the components having a pre-determined structure, the structure including an input port and an output port and a set of one or more electronic elements that are located between the input port and the output port, each the electronic element configured to be assigned a separate electrical property representing an amount of a resistance, an inductance or a capacitance, selecting synthesis data as a first portion of the electromagnetic analysis data, the synthesis data providing sufficient information to respectively synthesize at least two of the model electronic components respectively into at least two synthesized model electronic components and selecting non-synthesis data as a second portion of the electromagnetic analysis data, the non-synthesis data providing sufficient information to evaluate the at least two synthesized model electronic components, synthesizing at least two of the model electronic components into at least two synthesized model electronic components by assigning an amount of a resistance, an inductance or a capacitance to the electrical property of each the element of each the component such that resulting electromagnetic characteristics of each the component match electromagnetic characteristics of the synthesis data, evaluating the at least two synthesized model electronic components by comparing the resulting electromagnetic characteristics of each the synthesized model electronic component with electromagnetic characteristics of the non-synthesis data; and selecting at least one the synthesized model electronic component in response to the step of evaluating.

For a structure of each of the model electronic components, one or more equations are provided in accordance with the structure, the equations quantify a relationship between the structure and at least one electromagnetic coupling value within the synthesis data, and the one or more equations are solved to determine the amount of a resistance, an inductance or a capacitance that is assigned to at least one or more elements of the structure.

In some embodiments, at least one electromagnetic coupling value of the synthesis data is represented as a complex number that includes a real portion and an imaginary portion, and where at least one first equation is provided that relates the structure to the real portion of the complex number and where at least one second equation is provided that relates the structure to the imaginary portion of the complex number, and where each equation is solved to determine the amount of a resistance, an inductance or a capacitance that is assigned to the at least one or more elements of the structure.

In some embodiments, synthesis data includes one or more electromagnetic coupling values that are each expressed as an electromagnetic characteristic associated with one of a first set of synthesis frequencies and where non-synthesis data includes one or more electromagnetic coupling values that are each expressed as an electromagnetic characteristic associated with one of a second set of non-synthesis frequencies.

In some embodiments, there is no intersection between the first set of synthesis frequencies and the second set of non-synthesis frequencies. In some embodiments, there is at least one common frequency that is both a member of the first set of synthesis frequencies and of the second set of non-synthesis frequencies, and where the electromagnetic coupling values of the synthesis data and of the non-synthesis data that are associated with the at least one common frequency are expressed as a first electromagnetic characteristic and as a second electromagnetic characteristic respectively, and where the first electromagnetic characteristic is not equivalent to the second electromagnetic characteristic.

In some embodiments, the first set of synthesis frequencies includes two or more synthesis frequencies and the set of model components includes model electrical components having two or more elements. In some embodiments, the first set of synthesis frequencies includes four or more synthesis frequencies and the set of model components includes model electrical components having four or more elements. In some embodiments, the first set of synthesis frequencies are selected to optimize overall electromagnetic characteristics of a synthesized model electronic component with respect to their proximity to the electromagnetic characteristics of non-synthesis data.

In some embodiments, the electromagnetic coupling value is expressed as one or more of an electromagnetic characteristic of admittance, conductance or susceptance. Optionally, the model electronic components include a open circuited and/or short circuited transmission line stub.

In some embodiments, the synthesis data and the non-synthesis data are selected as data having one same associated electromagnetic measurement type and different associated frequencies. In other embodiments, the synthesis data and non-synthesis data do not include the same data and where the same data has both a same associated electromagnetic measurement type and same associated frequency.

In some embodiments, separate components are synthesized according to separate portions of synthesis data and electronic properties of the synthesized components are averaged in response to the separate portions of synthesis data. In some embodiments, the separate portions of synthesis data are averaged.

In some embodiments, a software program is configured for inputting electromagnetic analysis data associated with at least a first port and a second port of an electronic circuit, the data including a set of one or more electromagnetic coupling values that each represent at least one electromagnetic characteristic of the electronic circuit that is located between the first port and the second port, the software program is further configured for providing a set of one or more model electronic components, each of the components having a pre-determined structure, the structure including an input port and an output port and a set of one or more electronic elements that are located between the input port and the output port, each of the electronic elements is configured to be assigned a separate electrical property representing an amount of a resistance, an inductance or a capacitance, and configured for selecting synthesis data as a first portion of the electromagnetic analysis data, the synthesis data providing sufficient information to respectively synthesize at least two of the model electronic components respectively into at least two synthesized model electronic components, and selecting non-synthesis data as a second portion of the electromagnetic analysis data, the non-synthesis data providing sufficient information to evaluate the at least two synthesized model electronic components, and configured for synthesizing at least two of the model electronic components into at least two synthesized model electronic components by assigning an amount of a resistance, an inductance or a capacitance to the electrical property of each the element of each the component such that resulting electromagnetic characteristics of each the component match electromagnetic characteristics of the synthesis data, and configured for evaluating the at least two synthesized model electronic components by comparing the resulting electromagnetic characteristics of each the synthesized model electronic component with electromagnetic characteristics of the non-synthesis data, and configured for selecting at least one the synthesized model electronic component in response to the step of evaluating.

In other aspects, the invention is an apparatus for electromagnetic modeling of an electronic circuit, including a means for obtaining electromagnetic analysis data associated with at least a first port and a second port of an electronic circuit, the data including a set of one or more electromagnetic coupling values that each represent at least one electromagnetic characteristic of the electronic circuit that is located between the first port and the second port, and a means for providing a set of one or more model electronic components, each of the components having a pre-determined structure, the structure including an input port and an output port and a set of one or more electronic elements that are located between the input port and the output port, each the electronic element configured to be assigned a separate electrical property representing an amount of a resistance, an inductance or a capacitance, and a means for selecting synthesis data as a first portion of the electromagnetic analysis data, the synthesis data providing sufficient information to respectively synthesize at least two of the model electronic components respectively into at least two synthesized model electronic components; and selecting non-synthesis data as a second portion of the electromagnetic analysis data, the non-synthesis data providing sufficient information to evaluate the at least two synthesized model electronic components and means for synthesizing at least two of the model electronic components into at least two synthesized model electronic components by assigning an amount of a resistance, an inductance or a capacitance to the electrical property of each the element of each the component such that resulting electromagnetic characteristics of each the component match electromagnetic characteristics of the synthesis data and means for evaluating the at least two synthesized model electronic components by comparing the resulting electromagnetic characteristics of each the synthesized model electronic component with electromagnetic characteristics of the non-synthesis data; and means for selecting at least one the synthesized model electronic component in response to the step of evaluating.

In another aspect, the invention is a method for synthesizing an electronic component, comprising the steps of providing a set of one or more model electronic components, each of the components having a pre-determined structure, the structure including an input terminal and an output terminal and a set of one or more opaque electronic elements that are located between the input terminal and the output terminal, each the opaque electronic element is configured to be assigned a separate electrical property representing either an amount of a resistance, an inductance or a capacitance; and providing one or more equations in accordance with the structure, the equations quantify a relationship between each the opaque electronic element and an overall electromagnetic characteristic of the structure, and where the one or more equations are solved to determine either an amount of a resistance, an inductance or a capacitance that is to be assigned to each of the at least one or more opaque electronic elements of the structure so that the overall electromagnetic characteristic of the structure is equal to at least one electromagnetic coupling value representing an electromagnetic coupling between a first port and a second port represented within electromagnetic analysis data.

In another aspect, the invention is a method for synthesizing an electronic component, comprising the steps of providing a set of one or more model electronic components, each of the components having a pre-determined structure, the structure including an input terminal and an output terminal and a set of one or more functional electronic elements that are located between the input terminal and the output terminal, each functional electronic element is configured to be assigned a separate electrical property representing either an amount of a resistance, an inductance or a capacitance; and providing one or more equations in accordance with the structure, the equations quantify a relationship between each the opaque electronic element and an overall electromagnetic characteristic of the structure, and where the one or more equations are solved to determine either an amount of a resistance, an inductance or a capacitance that is to be assigned to each of the at least one or more opaque electronic elements of the structure so that the overall electromagnetic characteristic of the structure is equal to at least one electromagnetic coupling value representing an electromagnetic coupling between a first port and a second port represented within electromagnetic analysis data.

Figure 8A:
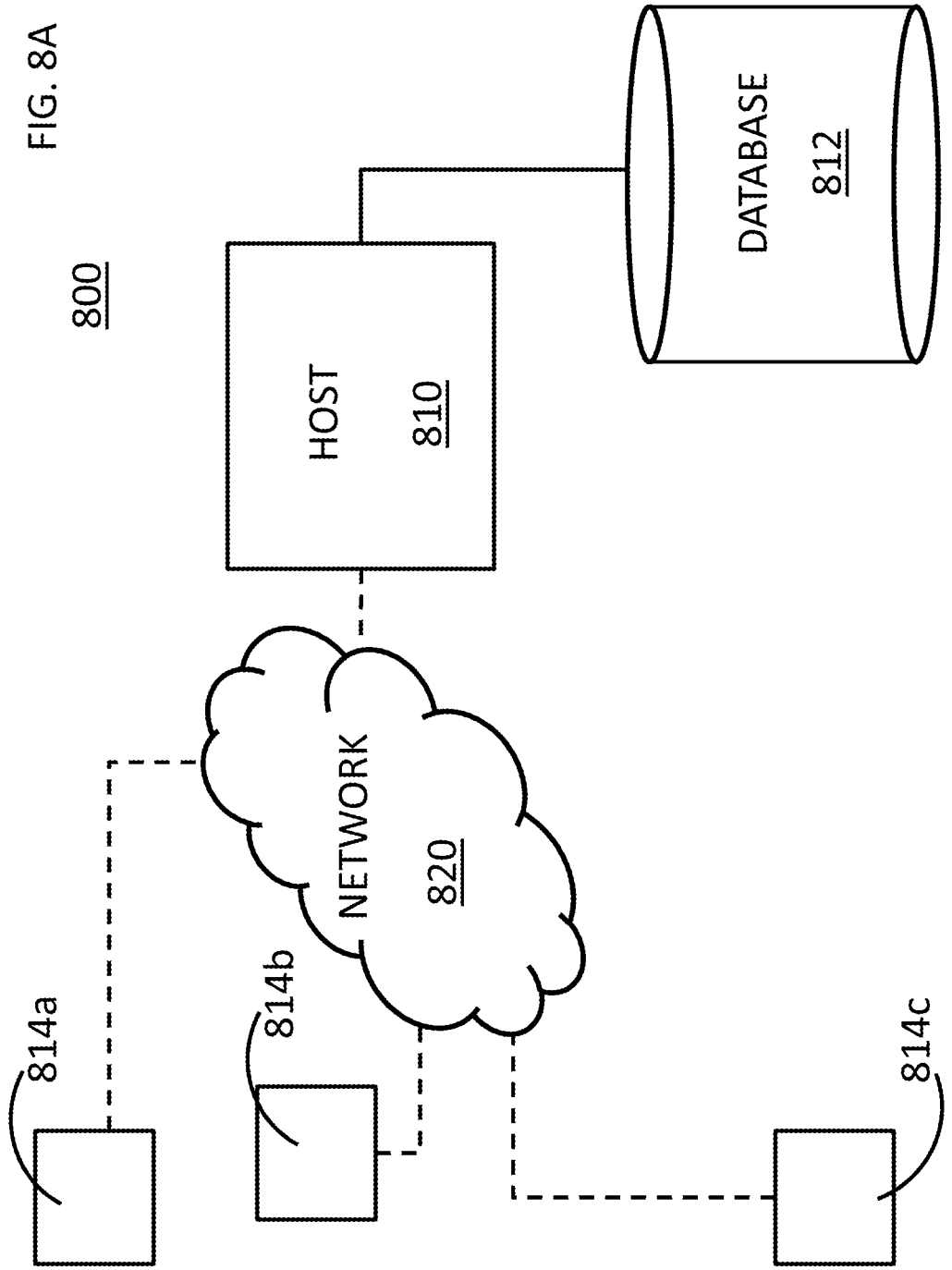
Figure 8B:
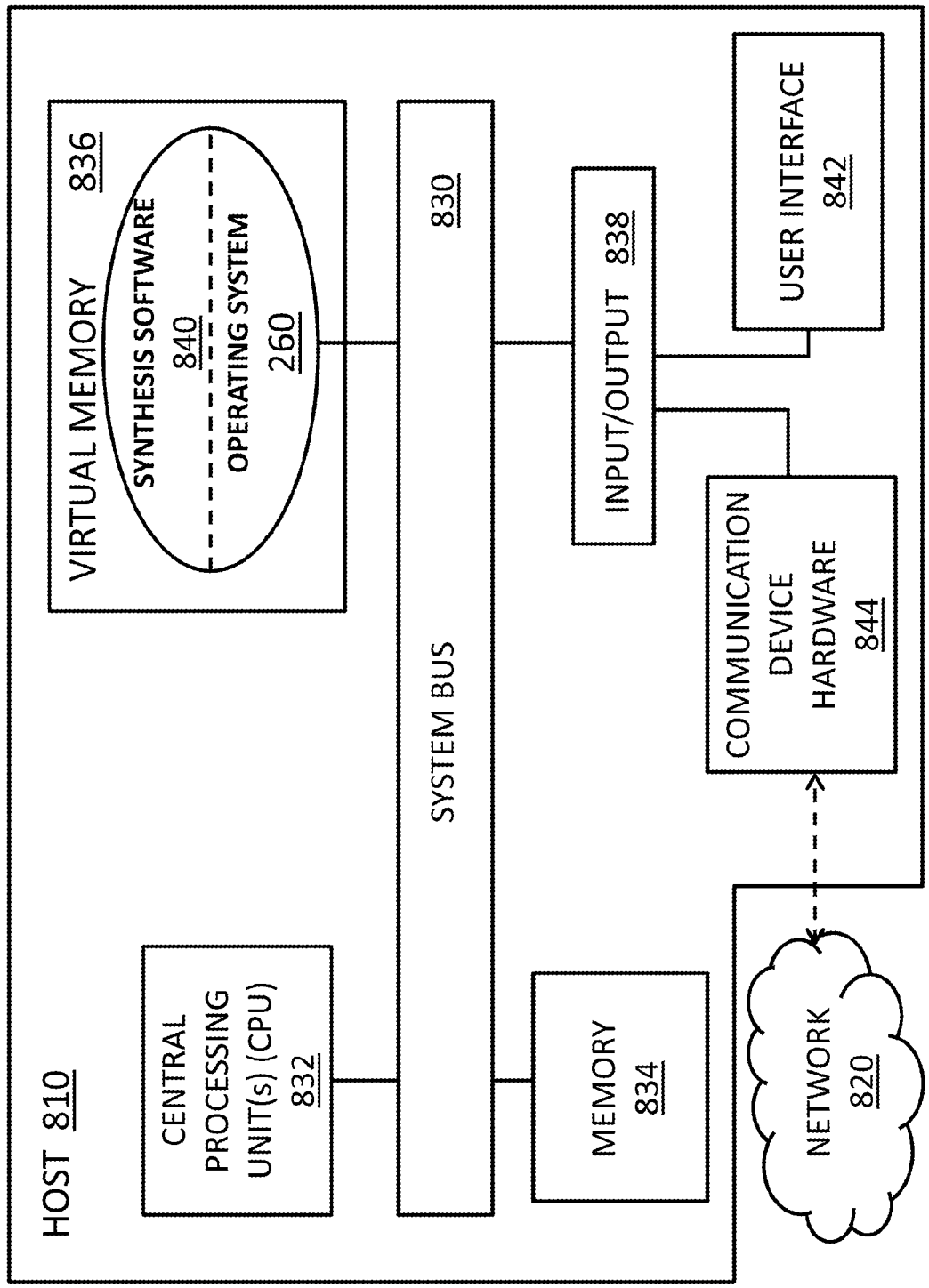

FIGS. 8A-8C illustrate an embodiment of the invention implemented as a network accessible electronic circuit component synthesis application. Referring to FIG. 8A, a network accessible application of the subject matter of the invention resides on a host computer 810. The host computer 810 stores data to and retrieves data from a data storage device 812. The host computer 810 functions as a network accessible node that communicates with other user interfacing network nodes 814a-814c that are accessible via a communications network 820.

In some embodiments, the network 820 is public accessible network or interconnection of multiple networks, such as for example, such as the world wide web (Internet). In other embodiments, the network is an access restricted wide or local area network, such as for example, virtual secure private network. Users of the electronic circuit synthesis application of the invention employ and interface with the user interfacing nodes 814a-814c to operate and interact with the electronic circuit synthesis application of the invention.

For example, in some embodiments, the network nodes 814a-814c can each be implemented as a personal computer which each execute an Internet Web browser program, such as for example, the Internet Explorer or Mozilla Firefox web browser programs. The Web browser program facilitates interaction with the synthesis application software of the invention that is operating and executing as a back end server program on the host computer 810 (See FIG. 8B). Optionally, the server program residing on the host computer 810 can transfer interpretable script, such as Java script for example, for processing by the browser program residing on the user interfacing nodes 814a-814c.

In some user scenarios, the location of users and their network nodes 814a-814c, relative to the location of the host computer 810 and/or relative each other, can span across state and/or national boundaries via a network or interconnection of multiple networks. For example, the host computer 810 can be located in the Canada and each of the user interfacing nodes 814a-814c can be located either within the United States, Mexico or Canada. Or for example, the host computer 810 and/or at least some user interfacing nodes 814a-814c can be located outside of the North America.

FIG. 8B is a simplified representation of the network accessible host computer 810. The previously described digital logic 710 that synthesizes electronic circuit components in response to processing electromagnetic analysis data, is implemented as network accessible application software 840 executing on the host computer 810. As shown, the software 840 is implemented as one or more operating system processes (programs) that interface with an operating system 846 also residing and executing on the host computer 810, via an applications programming interface provided by the operating system.

In some embodiments, the operating system is implemented as a Microsoft operating system, such as for example the Version 7 operating system. Alternatively, the software 840 can be programmed onto other operating systems and/or computing platforms, such as for example, programmed onto variants of UNIX, such as Linux or onto other Microsoft supplied operating systems, various IBM, real-time, or other Microsoft supplied operating systems. Preferably, the operating system 846 is designed to manage physical memory as virtual memory 836 within which the software 840 and operating system software 846 reside.

The software 840 directs operations of a processor 832, such as for example, a central processing unit (CPU) 832 that is accessible via a system bus 830 residing within the architecture of the host computer 810. User interface 842 hardware is available for the software 840 to direct interaction with a user and/or administrator of the host computer 810, but not necessarily a user of the application software 840.

The host computer 810 operates and interfaces with a computer network 820 via input/output 838 and communication device hardware 844. The network 820 enables the computer software application 840 to input and process directives (commands) to the application software 840 received from users of the other network nodes 814a-814c. The hardware of other user interfacing network nodes 814a-814c can be structured like that of the host computer to include a processor, system bus, memory, communication device hardware and user interface hardware etc.

FIG. 8C is a simplified representation of a user interface 850 under the direction of the application software 840. The user interface 850 is typically displayed onto image display hardware, such as a flat screen monitor residing a part of a user interfacing node 814a-814c. As shown, this user interface 850 can be displayed via a web browser program executing on the user interfacing node 814a-814c, such as, the Internet Explorer or Mozilla Firefox web browser programs, for example. This user interface 850 can be presented as a remotely hosted application among many applications that are presented to the user of the user interfacing node 814a-814c.

As shown, a user selectable button titled "Select Data" 852, when activated via a mouse selection by a user, invokes a dialog box (not shown) that enables a user located at a user interfacing node 814a-814c, to select electromagnetic analysis data accessible to the user interfacing node 814a-814c or to select electromagnetic analysis data that is accessible to the host computer 810 via its local operating system, for example. Electromagnetic analysis data that is stored local to or accessible to the user interfacing node 814a-814c is uploaded (transferred) to the host computer 810 from the user interfacing node 814a-814c upon selection.

Typically the electromagnetic analysis data is stored into an operating system accessible file. The contents of this data file can be formatted as binary encoded (machine readable) data or as human readable data. This binary encoded data can optionally be of a proprietary or an open and publicly defined format. Human readable data can be represented with ASCII encoded text and optionally be accompanied with markup language, such as for example, hypertext markup language (HTML).

As shown, a user selectable button titled "Select Structures" 854, when activated via a mouse selection by a user, invokes a dialog box and/or other popup window(s) (not shown) that enables a user to select from a set of predetermined structures, or optionally to define a structure, for which to synthesize. Each of these structures being a representation of an opaque (generic) structure (See FIG. 3A) or functional element structure (See FIG. 3B) including an arrangement of one or more model electronic components into a structure as shown. In some embodiments, the user is provided functional element structures with electrical components that have been each assigned to function specifically as a resistor, capacitor or inductor as shown in FIGS. 5C-5D and/or the user is provided with generic structures with (opaque) electrical components that have not yet been assigned to function specifically as a resistor, capacitor or inductor.

As shown, a user selectable button titled "Synthesize" 856, when activated via a mouse selection by a user initiates a process of synthesizing electronic components based upon the selected data and the one or more selected structures. Synthesized electronic structure(s) that specify specific values of resistance, capacitance and inductance that are assigned to electronic components are displayed to the user in one or more popup windows. Preferably, such structures are displayed graphically but can also be described non-graphically, such as text that defines serial/parallel connection/relationship between electronic components.

While the present invention has been explained with reference to the structure disclosed herein, it is not confined to the details set forth and this invention is intended to cover any modifications and changes as may come within the scope and spirit of the following claims.

What is claimed is:

1. A system for synthesizing an electronic component, comprising:
   at least one software application accessible by a network to direct operation of at least one central processing unit, said software application being configured to perform the following steps of:
   providing a user interface that enables a user to direct actions of said software application including:
   processing electromagnetic analysis data; and
   processing a representation of at least two model electronic components, each of said model electronic components having a pre-determined functional element structure; and
   processing a representation of one or more equations in accordance with each said structure, wherein said equations quantify a relationship between one or more functional electronic element(s) in the corresponding pre-determined functional element structure and an overall electromagnetic characteristic of that structure, and
   wherein at least one electromagnetic coupling value is included within said electromagnetic analysis data processed by said software application.

2. The system of claim 1 wherein said network is public network or interconnection of multiple networks including at least one public network.

3. The system of claim 1 wherein said network is at least one non-public network.

4. The system of claim 1 wherein said structure includes an input terminal and an output terminal and a set of one or more opaque electronic elements that are located between said input terminal and said output terminal.

5. The system of claim 1 wherein said structure includes an input terminal and an output terminal and a set of one or more functional electronic elements that are located between said input terminal and said output terminal.

6. The system of claim 5 wherein each functional electronic element is configured to be assigned a separate electrical property representing an amount of a resistance, an inductance or a capacitance.

7. The system of claim 6 wherein said one or more equations are solved to determine an amount of a resistance, an inductance or a capacitance that is to be assigned to each of said set of one or more functional electronic elements of said structure so that said overall electromagnetic characteristic of said structure is equal to at least one electromagnetic coupling value representing an electromagnetic coupling between a selected first port and a selected second port.

8. The system of claim 1 wherein said electromagnetic analysis data is selectable via said user interface.

9. The system of claim 1 wherein said representation of at least two model electronic components is selectable via said user interface.

10. The system of claim 1 wherein said model electronic components include two or more electronic elements and wherein said electromagnetic analysis data includes two distinct groupings of data that are associated with one or more synthesis frequencies, and wherein each of said two distinct groupings is a combination of frequency and electromagnetic measurement type, and wherein said electronic elements include a capacitor and inductor.

11. The system of claim 1 wherein said model electronic components include three or more electronic elements and wherein said electromagnetic analysis data includes three distinct groupings of data that are associated with two or more synthesis frequencies, and wherein each of said three distinct groupings is a combination of frequency and electromagnetic measurement type.

12. The system of claim 1 wherein said model electronic components include four or more electronic elements and wherein said electromagnetic analysis data includes four distinct groupings of data that are associated with two or more synthesis frequencies, and wherein each of said four distinct groupings is a combination of frequency and electromagnetic measurement type.

13. The system of claim 1 wherein said model electronic components include five or more electronic elements and wherein said electromagnetic analysis includes five distinct groupings of data that are associated with three or more synthesis frequencies, and wherein each of said five distinct groupings is a combination of frequency and electromagnetic measurement type.

14. The system of claim 1 wherein said functional element structure is derived from an opaque element structure.

15. Apparatus for synthesizing an electronic component, comprising:
   at least one network accessible software application directing operation of at least one central processing unit, said software application being configured to perform the following steps of:
   providing a user interface that enables a user to direct actions of said software application including:
   processing electromagnetic analysis data; and processing a representation of at least two model electronic components, each of said model electronic components having a pre-determined functional element structure; and processing a representation of one or more equations in accordance with each said structure, wherein said equations quantify a relationship between one or more functional electronic element(s) in the corresponding pre-determined functional element structure and an overall electromagnetic characteristic of that structure, and wherein at least one electromagnetic coupling value is included within said electromagnetic analysis data processed by said software application.

16. A system for synthesizing an electronic component, comprising:

at least one network accessible software program executing on at least one central processing unit, said software program being configured to perform the following steps of:

processing a representation of at least two model electronic components, each of said model electronic components having a pre-determined functional element structure, said structure including an input terminal and an output terminal and a set of one or more functional electronic elements that are located between said input terminal and said output terminal, each functional electronic element is configured to be assigned a separate electrical property representing an amount of a resistance, an inductance or a capacitance; and processing a representation of one or more equations in accordance with said structure, said equations quantify a relationship between said each functional electronic element and an overall electromagnetic characteristic of said structure, and wherein said one or more equations are solved to determine an amount of a resistance, an inductance or a capacitance that is to be assigned to each of said set of one or more functional electronic elements of said structure so that said overall electromagnetic characteristic of said structure is equal to at least one electromagnetic coupling value representing an electromagnetic coupling between a selected first port and a selected second port, and wherein said at least one electromagnetic coupling value is included within electromagnetic analysis data processed by said software program.

* * * * *